(12) United States Patent
Blanchard et al.

(10) Patent No.: US 12,188,863 B2
(45) Date of Patent: Jan. 7, 2025

(54) TERAHERTZ MODULATION SYSTEM AND METHOD OF MODULATING A TERAHERTZ SIGNAL

(71) Applicant: ECOLE DE TECHNOLOGIE SUPERIEURE, Montreal (CA)

(72) Inventors: François Blanchard, Montréal (CA); Frederic Nabki, Montréal (CA); Fatemah Amirkhan, Montréal (CA); Alexandre Robichaud, Chicoutimi (CA)

(73) Assignee: ECOLE DE TECHNOLOGIE SUPERIEURE, Montreal (CA)

( * ) Notice: Subject to any disclaimer, the term of this patent is extended or adjusted under 35 U.S.C. 154(b) by 47 days.

(21) Appl. No.: 17/912,550

(22) PCT Filed: Mar. 23, 2021

(86) PCT No.: PCT/CA2021/050379
§ 371 (c)(1),
(2) Date: Sep. 19, 2022

(87) PCT Pub. No.: WO2021/189135
PCT Pub. Date: Sep. 30, 2021

(65) Prior Publication Data
US 2023/0184672 A1      Jun. 15, 2023

Related U.S. Application Data

(60) Provisional application No. 62/993,113, filed on Mar. 23, 2020.

(51) Int. Cl.
*G01N 21/3586*      (2014.01)
(52) U.S. Cl.
CPC .............................. *G01N 21/3586* (2013.01)

(58) Field of Classification Search
CPC ........ A61B 6/4241; A61B 6/583; G01T 1/171
See application file for complete search history.

(56) References Cited

U.S. PATENT DOCUMENTS

| | | | |
|---|---|---|---|
| 2011/0187975 | A1 | 8/2011 | Michaels et al. |
| 2011/0315880 | A1 | 12/2011 | Nemirovsky |

(Continued)

FOREIGN PATENT DOCUMENTS

| | | |
|---|---|---|
| CN | 102520532 | 6/2012 |
| CN | 103219587 | 7/2013 |

(Continued)

OTHER PUBLICATIONS

Han, Z., Kohno, K., Fujita, H., Hirakawa, K., & Toshiyoshi, H. (2015). Tunable Terahertz Filter and Modulator Based on Electrostatic MEMS Reconfigurable SRR Array. IEEE Journal of Selected Topics in Quantum Electronics, 21, 114-122.

(Continued)

*Primary Examiner* — David P Porta
*Assistant Examiner* — Fani Polyzos Boosalis
(74) *Attorney, Agent, or Firm* — Norton Rose Fulbright Canada LLP; Reno Lessard

(57) ABSTRACT

There is described a terahertz modulation system. The terahertz modulation system generally has a terahertz signal emitter emitting a terahertz signal along a path; a modulation unit having a substrate and an electromechanical transducer actuatably mounted to said substrate, said electromechanical transducer having a terahertz interacting surface in said path receiving said terahertz signal and moving in back-and-forth sequences between first and second positions relative to said path upon actuation with a modulation signal, said moving modulating at least a portion of said terahertz signal; and a terahertz signal detector downstream from said modulation unit along said path, said terahertz signal detector synchro- (Continued)

nously measuring said modulated portion of said terahertz signal using said modulation signal, and generating a differential signal indicative thereof.

20 Claims, 21 Drawing Sheets

(56) References Cited

U.S. PATENT DOCUMENTS

| | | | |
|---|---|---|---|
| 2016/0099701 A1* | 4/2016 | Rinaldi | H03H 9/13 422/90 |
| 2016/0313177 A1 | 10/2016 | Sherry | |
| 2018/0026581 A1 | 1/2018 | Dutta et al. | |
| 2019/0058242 A1 | 2/2019 | Tabe | |

FOREIGN PATENT DOCUMENTS

| | | |
|---|---|---|
| CN | 103575403 | 2/2014 |
| CN | 104506167 | 4/2015 |
| CN | 104678598 | 6/2015 |
| CN | 105129717 | 12/2015 |
| CN | 105347295 | 2/2016 |
| CN | 105445965 | 3/2016 |
| CN | 105640410 | 5/2016 |
| CN | 102739130 | 7/2016 |
| CN | 105824138 | 8/2016 |
| CN | 106200013 | 12/2016 |
| CN | 106449442 | 2/2017 |
| CN | 106450615 | 2/2017 |
| CN | 106932357 | 7/2017 |
| CN | 107037505 | 8/2017 |
| CN | 107885007 | 4/2018 |
| CN | 108232462 | 6/2018 |
| CN | 109031705 | 12/2018 |
| CN | 109037951 | 12/2018 |
| CN | 109143618 | 1/2019 |
| CN | 109799625 | 5/2019 |
| CN | 109818683 | 5/2019 |
| CN | 208847859 | 5/2019 |
| CN | 110095888 | 8/2019 |
| CN | 110221367 | 9/2019 |
| CN | 110426866 | 11/2019 |
| CN | 110426867 | 11/2019 |
| CN | 110531540 | 12/2019 |
| CN | 110534909 | 12/2019 |
| KR | 20130071912 | 7/2013 |
| KR | 101702489 | 2/2017 |
| WO | 2017007265 | 1/2017 |

OTHER PUBLICATIONS

Z. T. Ma, Z. X. Geng, Z. Y. Fan, J. Liu &H.D. Chen (2018) Modulators for Terahertz Communication: The Current State of the Art. AAAS. Research Colume 2019, Article ID 6482975, 22 pages. https://doi.org/10.34133/2019/6482975.

Wang et al. A Review of THz Modulators with Dynamic Tunable Metasurfaces Nanomaterials 2019, 9, 965; doi:10.3390/nano9070965.

* cited by examiner

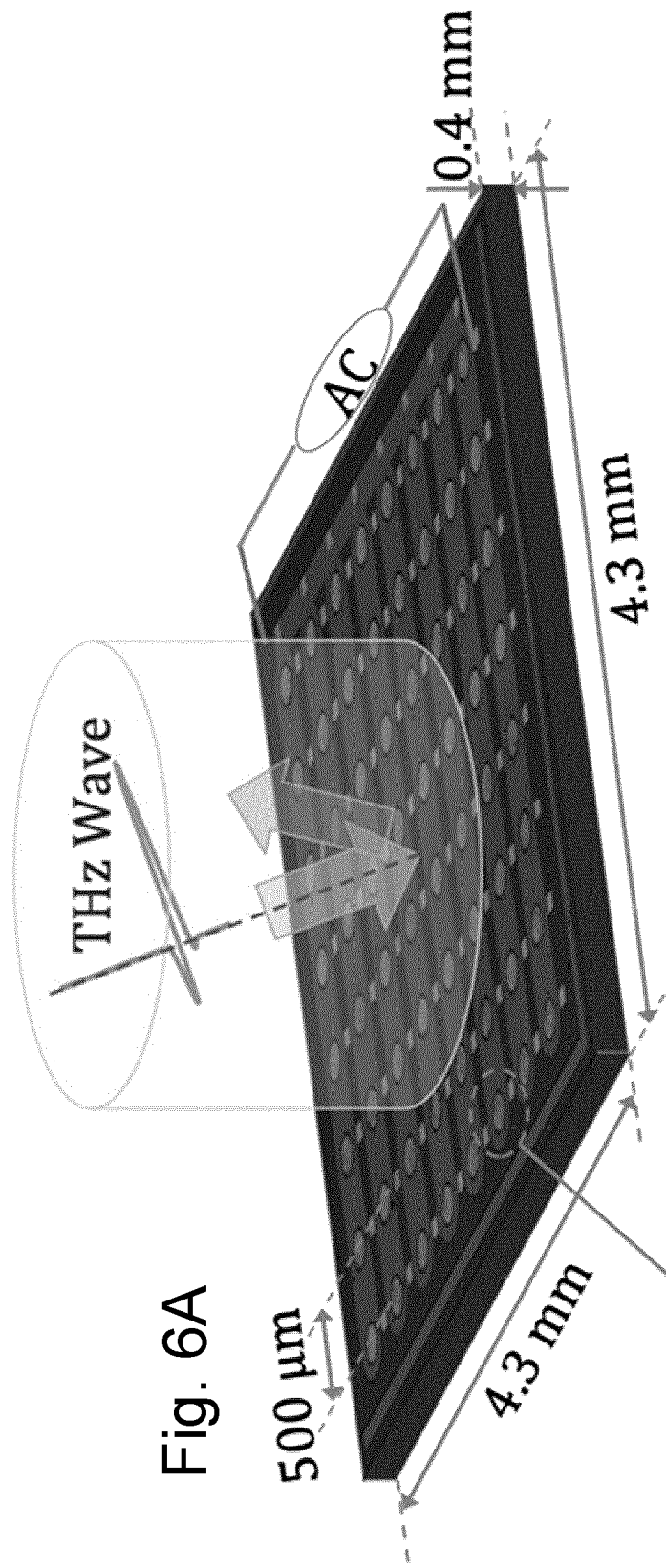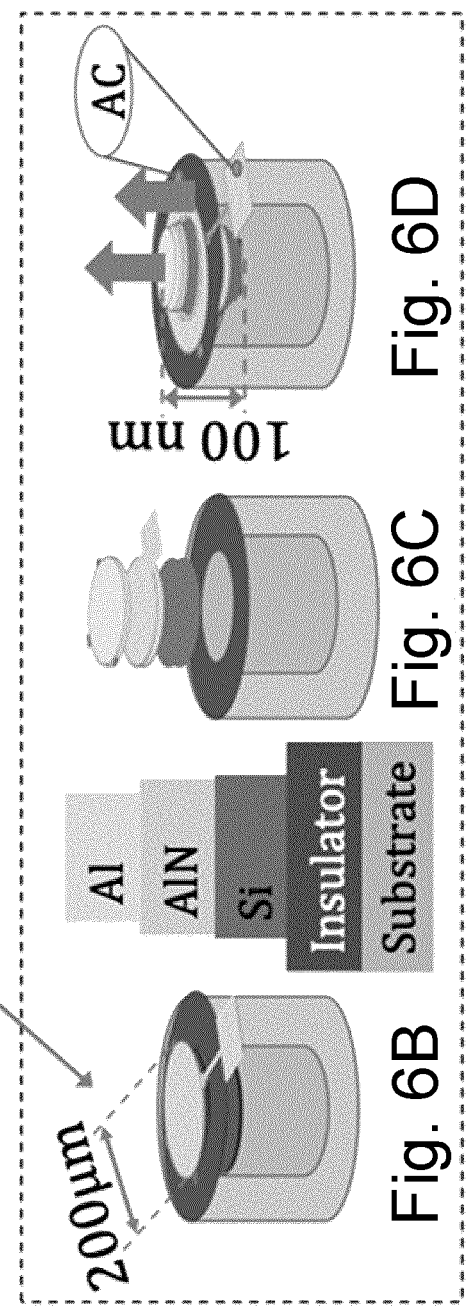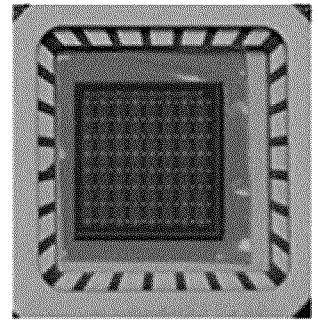

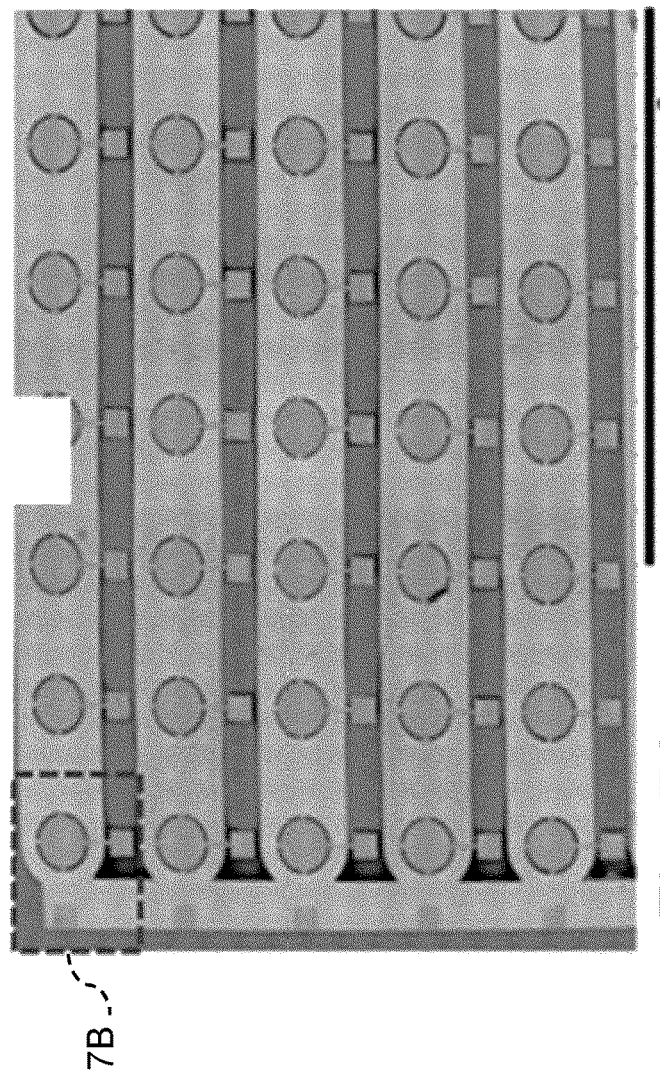
Fig. 7A
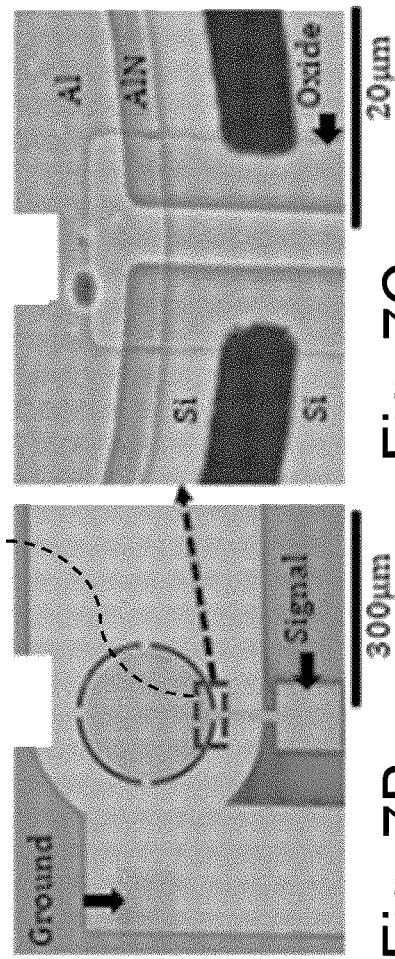
Fig. 7B
Fig. 7C

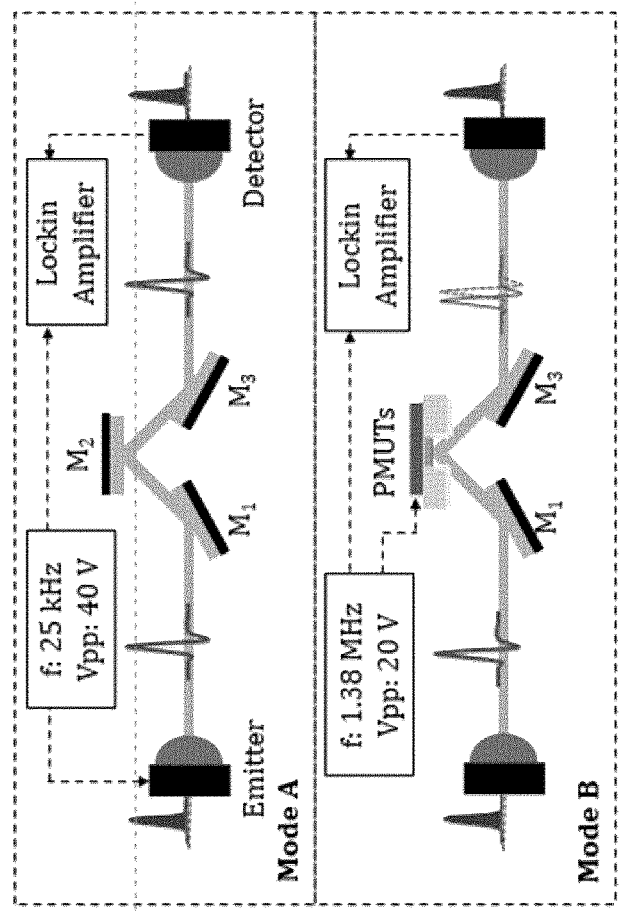
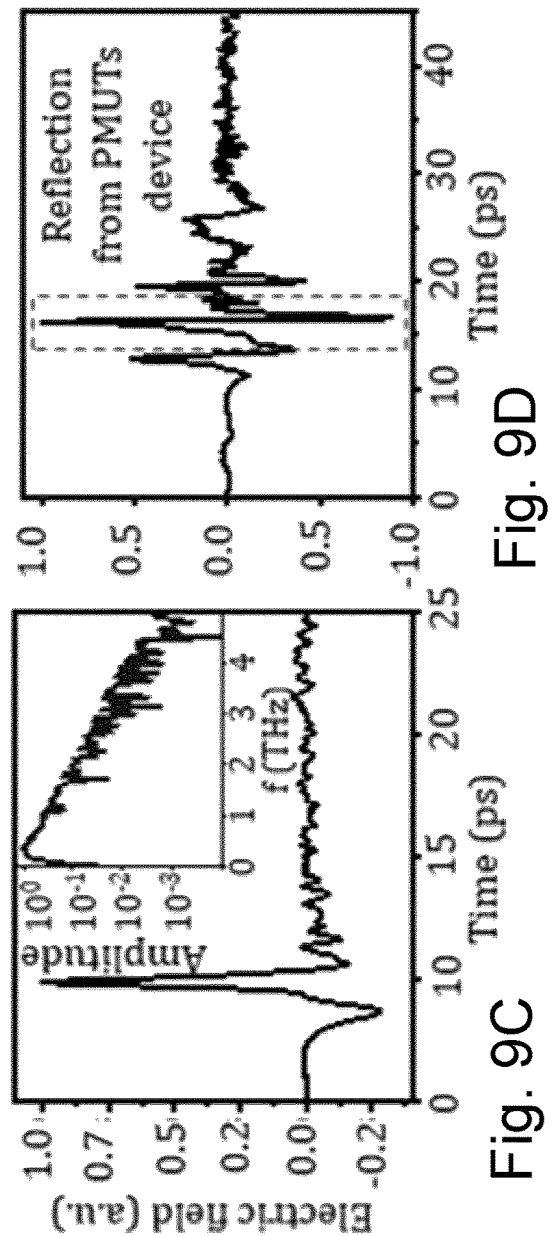
Fig. 9A
Fig. 9B
Fig. 9C
Fig. 9D

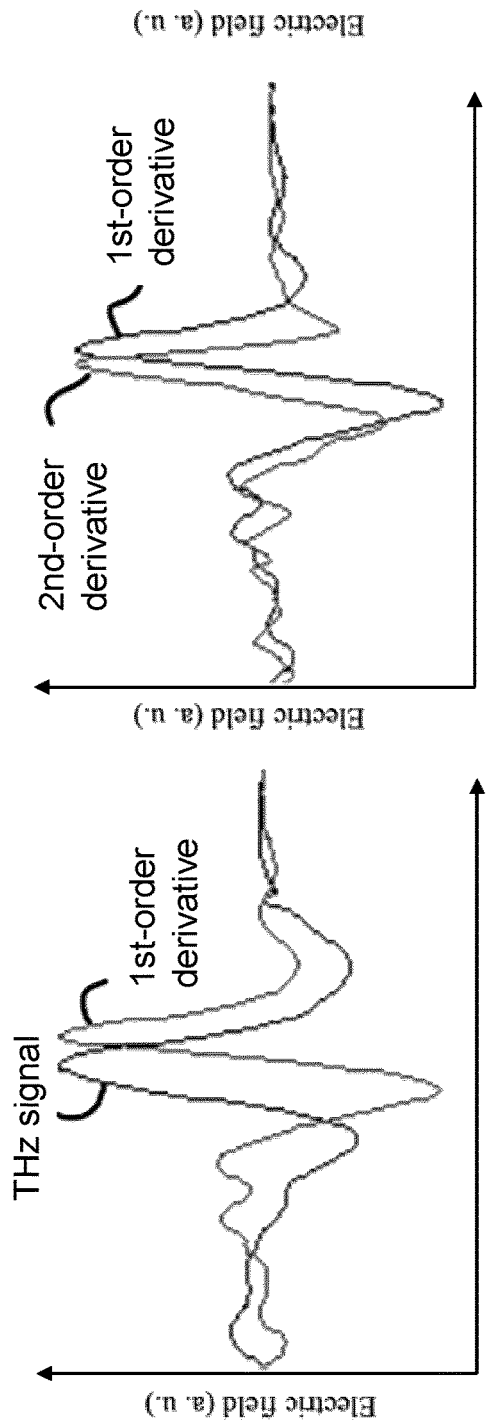
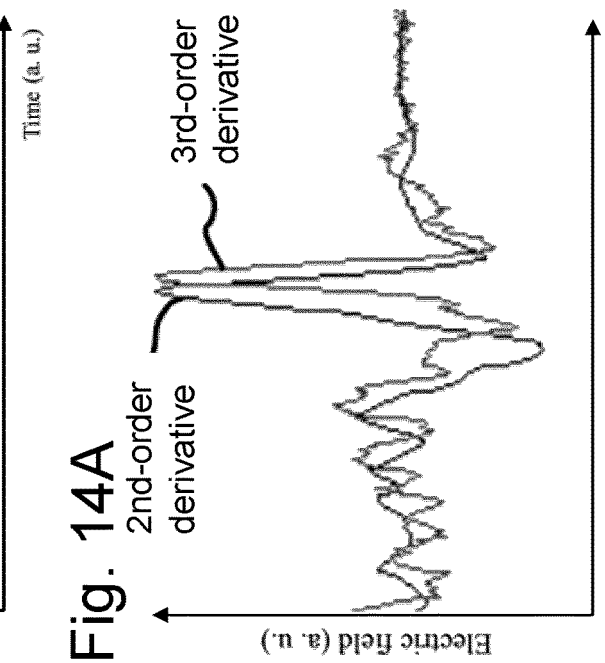
Fig. 14A
Fig. 14B
Fig. 14C
Fig. 14D

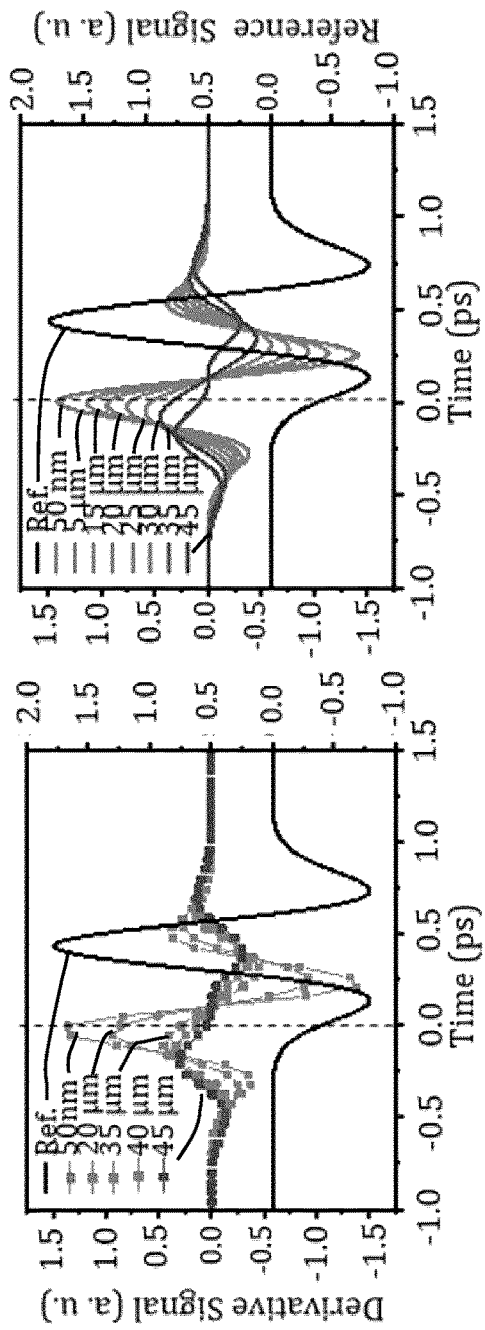
Fig. 15A
Fig. 15B
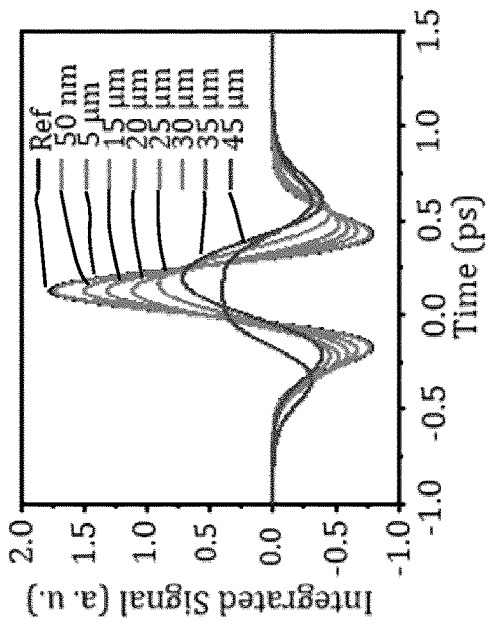
Fig. 15C

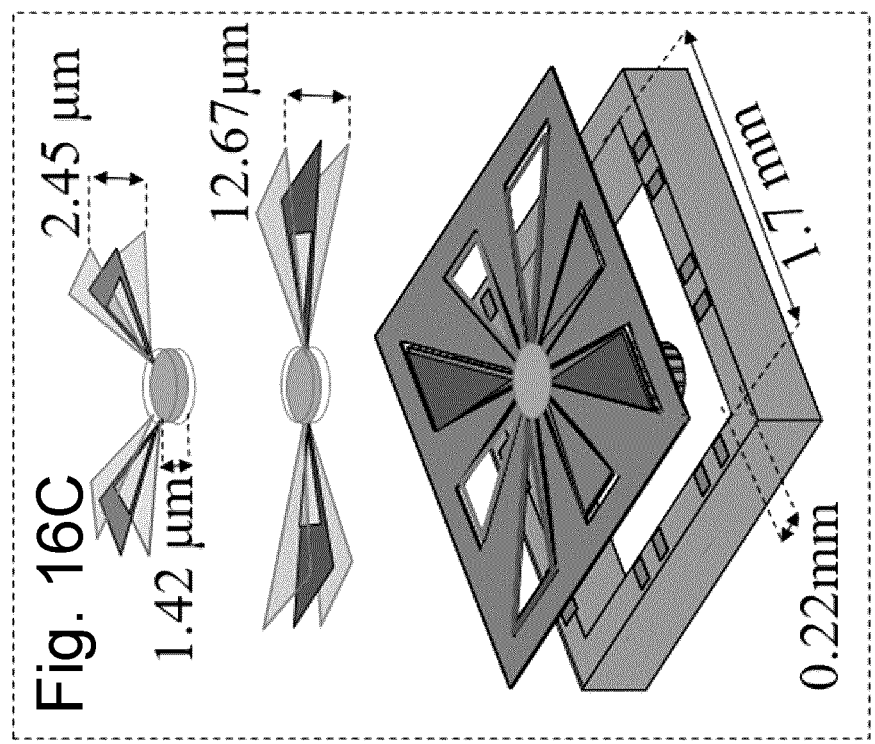
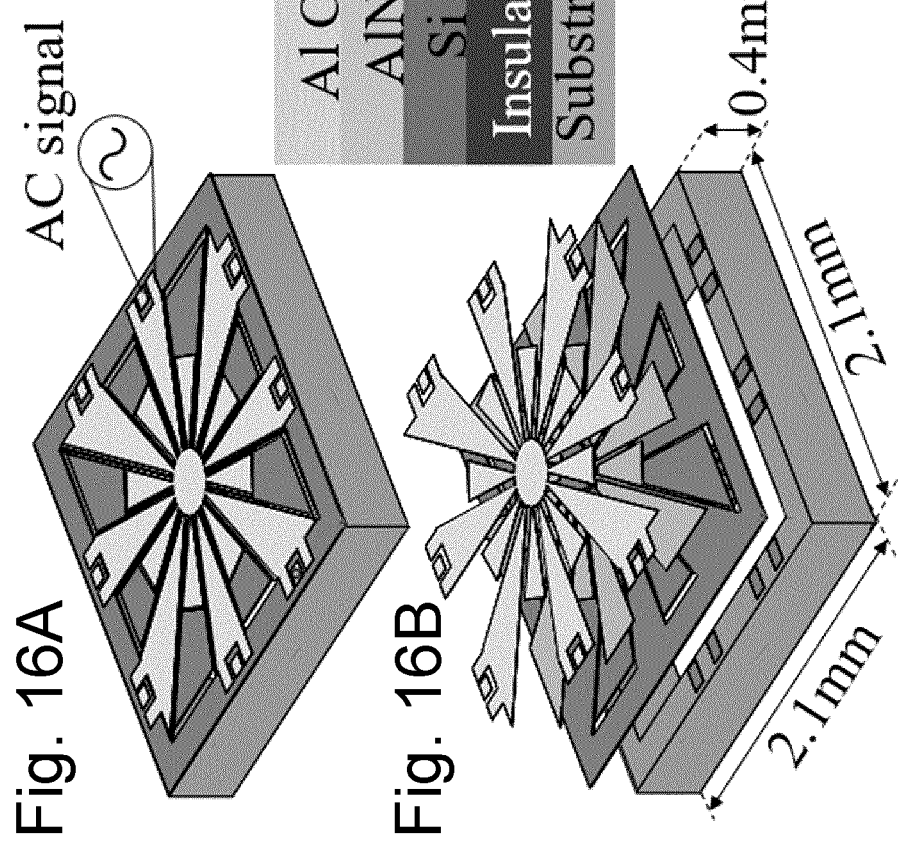
Fig. 16A  Fig. 16B  Fig. 16C

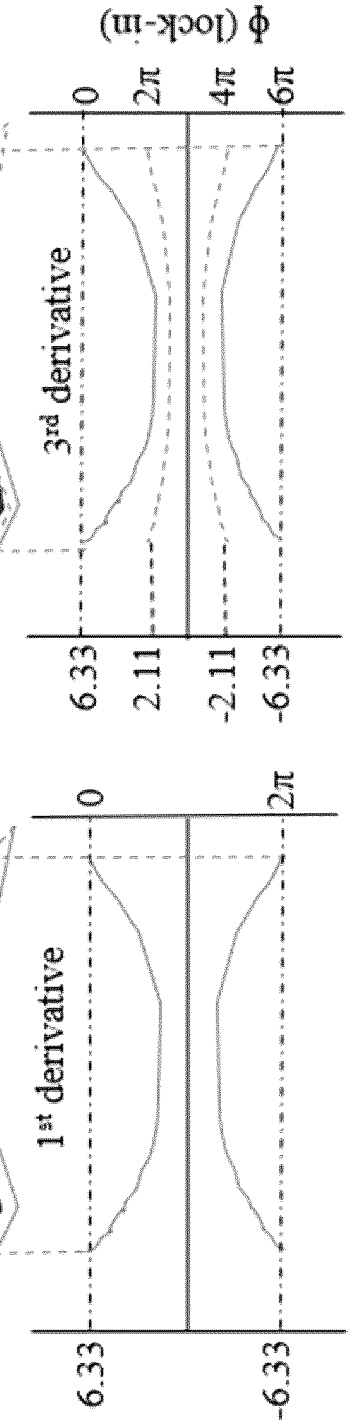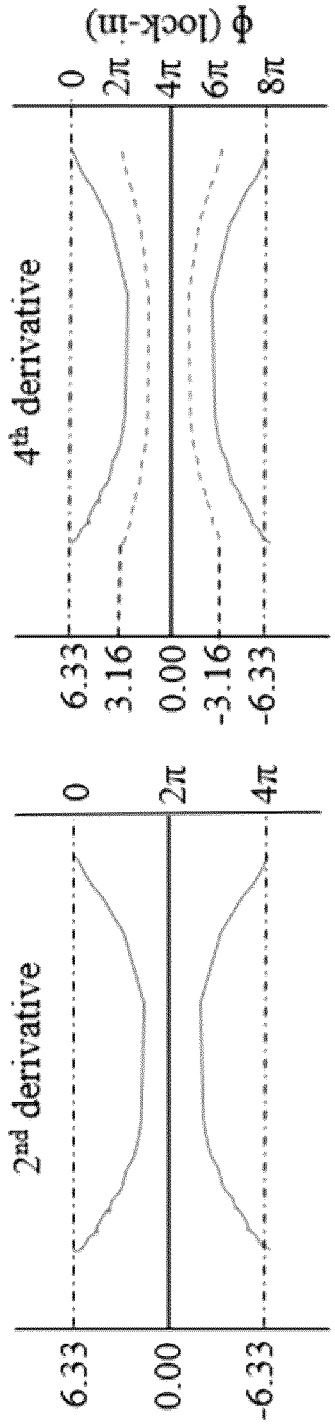
Fig. 17A  Fig. 17C  Fig. 17B  Fig. 17D

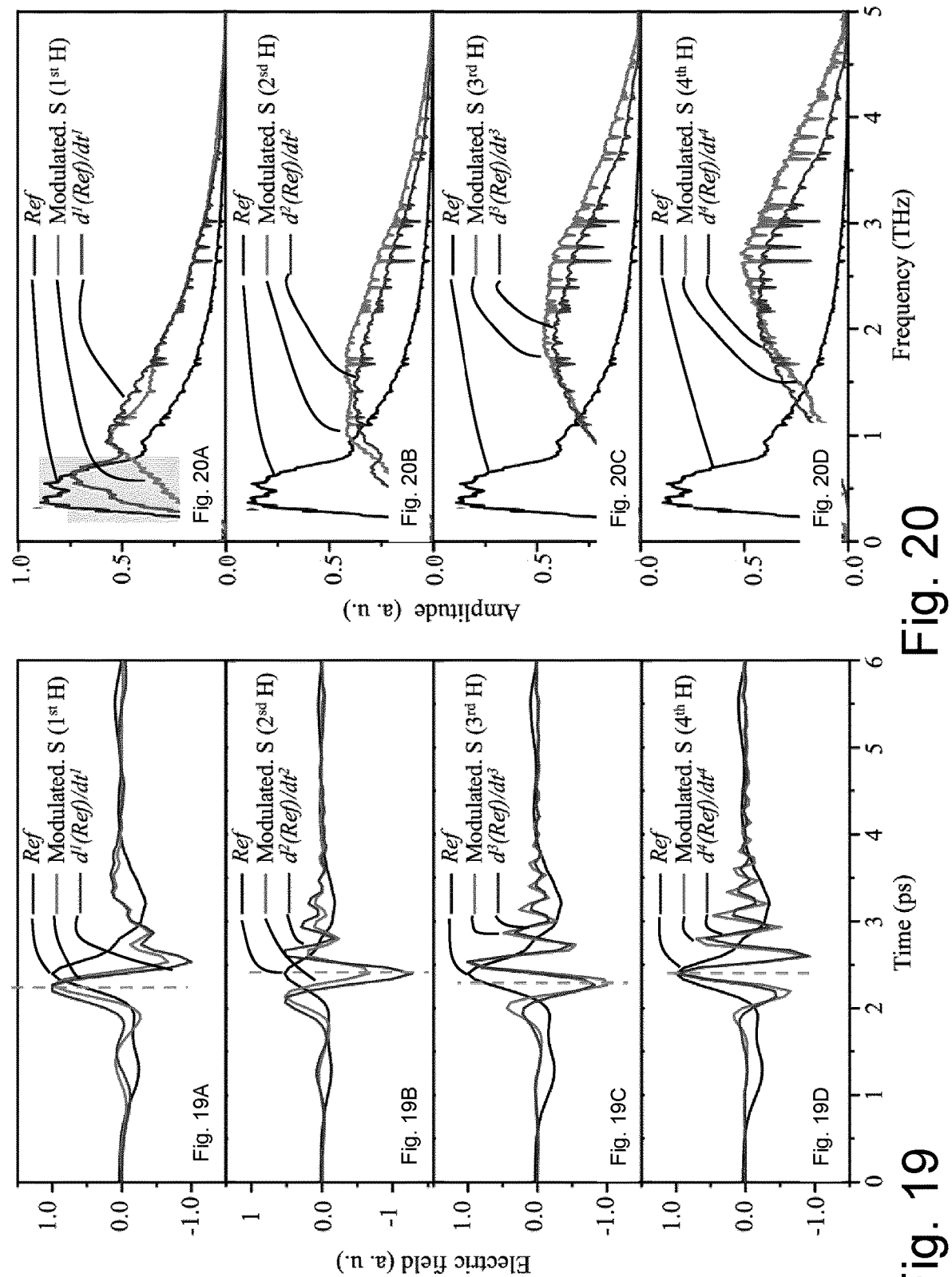

TERAHERTZ MODULATION SYSTEM AND METHOD OF MODULATING A TERAHERTZ SIGNAL

FIELD

The improvements generally relate to modulation and more specifically to terahertz signal modulation.

BACKGROUND

Modulation is a process with which properties of a periodic waveform are varied over time with a modulation signal that typically contains information to be transmitted. Once received, the modulated signal can be demodulated to retrieve the transmitted information. Known examples of modulation involves amplitude modulation (AM) and frequency modulation (FM) of radio signals, which were found to be advantageous to communicate over long distances, as such electromagnetic signals experience negligible loss as they propagate through air. Although existing modulation systems are satisfactory to a certain degree, there remains room for improvement, especially in modulating electromagnetic signals in a terahertz region of the electromagnetic spectrum.

SUMMARY

In an aspect of the present disclosure, there is described a terahertz modulation system. The terahertz modulation system has a terahertz signal emitter which emits a terahertz signal along a given path. A modulation unit is disposed in the path so as to interfere with the terahertz signal propagating along the given path. The modulation unit has a substrate and one or more electromechanical transducers (hereinafter "the electromechanical transducer") actuatably mounted to the substrate. The electromechanical transducer can be a piezoelectric transducer, an electrostatic transducer and the like. The electromechanical transducer has a terahertz interacting surface which is positioned to interfere with the terahertz signal as it propagates along the given path. Moreover, the electromechanical transducer is designed so that the terahertz interacting surface moves in a resonant manner between first and second positions relative to the given path when the electromechanical transducer is actuated with a modulation signal at a resonance frequency of the electromechanical transducer. This interference process thereby modulates a portion of the terahertz signal impinging on the terahertz interacting surface during actuation. The terahertz modulation system has a terahertz signal detector downstream from the modulation unit along the given path. It is intended that the terahertz signal detector is synchronized with the resonance frequency of the electromechanical transducer via the modulation signal. Accordingly, the terahertz signal detector can synchronously measure the modulated portion of the terahertz signal, and generate a differential signal indicative thereof.

It was found that, in some embodiments, the generated differential signal can be indicative of a difference between the terahertz signal interacting with the terahertz interacting surface at the first position and the terahertz signal interacting with the terahertz interacting surface at the second position over a given period of time. As such, the measured difference can indicate a rate of change of the terahertz signal over the period of time. It was thus found that the terahertz modulation system can act as a terahertz signal differentiator measuring differential variations of the terahertz signal instead of the actual terahertz signal. In these embodiments, the terahertz modulation system can be provided with a controller determining an indication of the terahertz signal by integrating the differential variations or signal over the period of time.

In accordance with a first aspect of the present disclosure, there is provided a terahertz modulation system comprising: a terahertz signal emitter emitting a terahertz signal along a path; a modulation unit having a substrate and an electromechanical transducer actuatably mounted to said substrate, said electromechanical transducer having a terahertz interacting surface in said path receiving said terahertz signal and moving in back-and-forth sequences between first and second positions relative to said path upon actuation with a modulation signal, said moving modulating at least a portion of said terahertz signal; and a terahertz signal detector downstream from said modulation unit along said path, said terahertz signal detector synchronously measuring said modulated portion of said terahertz signal using said modulation signal, and generating a differential signal indicative thereof.

Further in accordance with the first aspect of the present disclosure, said modulation signal can for example carry a resonance frequency of said electromechanical transducer, said terahertz interacting surface can for example move in resonance between said first and second positions.

Still further in accordance with the first aspect of the present disclosure, said differential signal can for example be indicative of a difference between said terahertz signal interacting with said terahertz interacting surface at said first position and the terahertz signal interacting with said terahertz interacting surface at said second position over a given period of time.

Still further in accordance with the first aspect of the present disclosure, said difference can for example indicate a rate of change of an electric field amplitude of said terahertz signal over said period of time.

Still further in accordance with the first aspect of the present disclosure, the system can for example further comprise a controller having a processor and a memory having stored thereon instructions that when executed by said controller perform the steps of: determining an indication of said terahertz signal by integrating said differential signal over said period of time.

Still further in accordance with the first aspect of the present disclosure, said terahertz interacting surface can for example be a terahertz reflecting surface receiving said terahertz signal from an upstream portion of said path and reflecting said terahertz signal along a downstream portion of said path.

Still further in accordance with the first aspect of the present disclosure, said electromechanical transducer can for example comprise a plurality of electromechanical transducers actuatably mounted to said substrate, said electromechanical transducers can for example have terahertz interacting surfaces being independent from one another.

Still further in accordance with the first aspect of the present disclosure, said electromechanical transducers can for example have a common resonance frequency.

Still further in accordance with the first aspect of the present disclosure, said terahertz interacting surfaces of said electromechanical transducers can for example form a plane moving in resonance between said first and second positions relative to said path upon actuation with a modulation signal at said common resonance frequency.

Still further in accordance with the first aspect of the present disclosure, said terahertz interacting surfaces of said electromechanical transducers can for example move independently from one another upon actuation with respective modulation signals at different frequencies.

Still further in accordance with the first aspect of the present disclosure, said terahertz signal detector can for example include a terahertz signal detector unit and a lock-in amplifier, said terahertz signal detector unit measuring an unmodulated portion and said modulated portion of said terahertz signal, and generating a detection signal, said lock-in amplifier receiving said detection signal and isolating said modulated portion of said terahertz signal based on said modulation signal.

Still further in accordance with the first aspect of the present disclosure, at least one of said differential signal and said detection signal can for example have at least an n-th order harmonic therein, with n denoting a positive integer, said n-th order harmonic corresponding to an n-th order derivative of said terahertz signal.

Still further in accordance with the first aspect of the present disclosure, said electromechanical transducer can for example include an annular insulating member received on said substrate and defining a cylindrical cavity therein, a conductive disk received in said cylindrical cavity and axially movable within said cylindrical cavity, and a conductive terminal mounted on said annular insulating member proximate said cavity, said conductive disk having said terahertz interacting surface, said electromechanical transducer being actuatable by supplying said modulation signal to said conductive terminal, thereby axially moving said conductive disk in back and forth sequences along said cylindrical cavity.

Still further in accordance with the first aspect of the present disclosure, said electromechanical transducer can for example be an ultrasound transducer.

Still further in accordance with the first aspect of the present disclosure, said electromechanical transducer can for example be a piezoelectric transducer.

Still further in accordance with the first aspect of the present disclosure, said terahertz signal can for example have an electric field of a given amplitude and of a given phase varying over time, said differential signal can for example be indicative of a rate of change of said amplitude over time.

Still further in accordance with the first aspect of the present disclosure, the system can for example further comprise resolving a phase of said terahertz signal based on said rate of change of said amplitude over time. In some embodiments, a refractive index profile of a sample through which the unmodulated or modulated portion of said terahertz signal have propagated can be determined based on the retrieved phase of the terahertz signal. In some embodiments, interfaces in the sample are revealed by slope changes in the time-domain differential signal. For instance, in some embodiments, clear interfaces can for example be resolved by identifying odd-order differential signals, e.g., the differential signal crossing zero.

In accordance with a second aspect of the present disclosure, there is provided a method of modulating a terahertz signal, the method comprising: emitting a terahertz signal along a path and across a terahertz interacting surface of an electromechanical transducer; modulating at least a portion of said terahertz signal by moving said terahertz interacting surface of said electromechanical transducer in back-and-forth sequences between first and second positions across said path, said moving resulting from actuating said electromechanical transducer with a modulation signal; and synchronously measuring said modulated portion of said terahertz signal using said modulation signal, and generating a differential signal indicative thereof.

Further in accordance with the second aspect of the present disclosure, said modulation signal can for example carry a resonance frequency of said electromechanical transducer, said terahertz interacting surface can for example move in resonance between said first and second positions.

Still further in accordance with the second aspect of the present disclosure, said differential signal can for example be indicative of a difference between said terahertz signal interacting with said terahertz interacting surface at said first position and said terahertz signal interacting with said terahertz interacting surface at said second position over a given period of time.

Still further in accordance with the second aspect of the present disclosure, said difference can for example indicate a rate of change of said terahertz signal over said period of time.

Still further in accordance with the second aspect of the present disclosure, the method can for example further comprise, using a controller, determining an indication of said terahertz signal by integrating said generated differential signal over said period of time.

Still further in accordance with the second aspect of the present disclosure, said terahertz signal can for example have an electric field of a given amplitude and of a given phase varying over time, said differential signal being indicative of a rate of change of said amplitude over time.

Still further in accordance with the second aspect of the present disclosure, the method can for example further comprise, using a controller, resolving a phase of said terahertz signal based on said rate of change of said amplitude over time.

Still further in accordance with the second aspect of the present disclosure, said differential signal can for example have at least an n-th order harmonic therein, with n denoting a positive integer, said n-th order harmonic corresponding to an n-th order derivative of said terahertz signal.

Still further in accordance with the second aspect of the present disclosure, the system can for example further comprise resolving a phase of said terahertz signal based on said rate of change of said amplitude over time. In some embodiments, a refractive index profile of a sample through which the unmodulated or modulated portion of said terahertz signal have propagated can be determined based on the retrieved phase of the terahertz signal. In some embodiments, interfaces in the sample are revealed by slope changes in the time-domain differential signal. For instance, in some embodiments, clear interfaces can for example be resolved by identifying odd-order differential signals, e.g., the differential signal crossing zero.

In accordance with a third aspect of the present disclosure, there is provided a terahertz time-domain derivative spectrometer for analyzing a sample, the terahertz time-domain derivative spectrometer comprising: a terahertz signal emitter emitting a terahertz signal along a path extending across said sample, said terahertz signal having an electric field of a given amplitude and a given phase varying over time; a terahertz interacting surface receiving said terahertz signal and moving in back-and-forth sequences between first and second positions upon actuation with a modulation signal; a terahertz signal detector synchronously measuring said modulated portion of said terahertz signal using the modulation signal, and generating a differential signal indicative of a derivative of said varying amplitude over time; a controller performing a time-domain spectroscopic measurement on said sample based on said differential signal, including retrieving at least one of the given amplitude and the given phase varying over time.

Further in accordance with the third aspect of the present disclosure, said retrieving can for example include integrating said differential signal.

Still further in accordance with the third aspect of the present disclosure, the spectrometer can for example further perform a step of characterizing a refractive index profile of said sample based on the retrieved phase of the terahertz signal. In some embodiments, interfaces in the sample are revealed by slope changes in the time-domain differential signal. For instance, in some embodiments, clear interfaces can for example be resolved by identifying odd-order differential signals, e.g., the differential signal crossing zero.

Many further features and combinations thereof concerning the present improvements will appear to those skilled in the art following a reading of the instant disclosure.

DESCRIPTION OF THE FIGURES

In the figures,

FIG. 6A is an oblique view of an example of a modulation unit having an array of piezoelectric micro machined ultrasonic transducers (PMUTs), in accordance with one or more embodiments;

FIG. 6B is an exploded view of one of the PMUTs of FIG. 6A, showing an annular insulating member and a conductive disk, in accordance with one or more embodiments;

FIG. 6C is an oblique view of the annular insulating member of FIG. 6B, in accordance with one or more embodiments;

FIG. 6D is an oblique view of the PMUT of FIG. 6B, showing the conductive disk moving in a back and forth sequence within the annular insulating member upon activation with a modulation signal, in accordance with one or more embodiments;

FIG. 6E is a top plan view of the array of PMUTs, showing a substrate provided in the form of a gold leadless chip carrier (LCC) package, in accordance with one or more embodiments;

FIG. 7A is a scanning electron microscope (SEM) micrograph of the array of PMUTs of FIG. 6A, in accordance with one or more embodiments;

FIG. 7B is an enlarged view of the SEM micrograph of FIG. 7A, showing inset 7B of FIG. 7A, in accordance with one or more embodiments;

FIG. 7C is an enlarged view of the SEM micrograph of FIG. 7A, showing inset 7C of FIG. 7B, in accordance with one or more embodiments;

FIG. 9A is a schematic view of an example of a terahertz modulation system in which a terahertz signal emitter is modulated with a modulation signal;

FIG. 9B is a schematic view of an example of a terahertz modulation system, incorporating the modulation unit of FIG. 6A, in accordance with one or more embodiments;

FIG. 9C is a graph showing measured electric field as a function of time for a terahertz signal modulated using the terahertz modulation system of FIG. 9A;

FIG. 9D is a graph showing measured electric field as a function of time for a terahertz signal modulated using the terahertz modulation system of FIG. 9B;

FIG. 100 is a graph showing measured electric field as a function of time for terahertz signals modulated with the terahertz modulation system of FIG. 9B with modulation signals at the resonance frequency and having different voltages, in accordance with one or more embodiments;

FIGS. 14A-D are graphs showing an example terahertz signal, a first order derivative of the terahertz signal, a second order derivative of the terahertz signal, a third order derivation signal and a fourth order derivative of the terahertz signal, in accordance with one or more embodiments;

FIG. 15A is a graph showing time variations of the calculated first derivative of a simulated terahertz signal based on different displacements for a discrete timing position of 53.3 fs, in accordance with one or more embodiments;

FIG. 15B is a graph showing time variations of the calculated first derivative of a simulated terahertz signal based on different displacements for a discrete timing position of 0.33 fs, in accordance with one or more embodiments;

FIG. 15C is a graph showing integration of the first derivative signal as function of time for the different displacements of FIG. 15A, in accordance with one or more embodiments;

FIG. 16A is an oblique view of an example of a modulation unit, showing a piezoelectric micromachine (PM) device, in accordance with one or more embodiments;

FIG. 16B is an exploded view of the PM device of FIG. 16A, showing wings over a silicon-on-insulation substrate, in accordance with one or more embodiments;

FIG. 16C is an exploded view of the PM device of FIG. 16A, showing amplitude of movement of the wings, in accordance with one or more embodiments;

FIGS. 17A-D are graphs showing a relationship between the motion of a wing of the PM device of FIG. 16A as a function of lock-in detection phase for first, second, third and fourth harmonic functions of the lock-in amplifier, respectively, in accordance with one or more embodiments;

FIGS. 19A-D are graphs showing electric field profiles of reference THz signals, modulated THz signals and associated first-, second-, third- and fourth-order derivatives of the THz signal, in accordance with one or more embodiments;

FIGS. 20A-D are graphs showing spectra of the electric field profiles of FIGS. 19A-D, respectively, in accordance with one or more embodiments;

DETAILED DESCRIPTION

Figure 1:
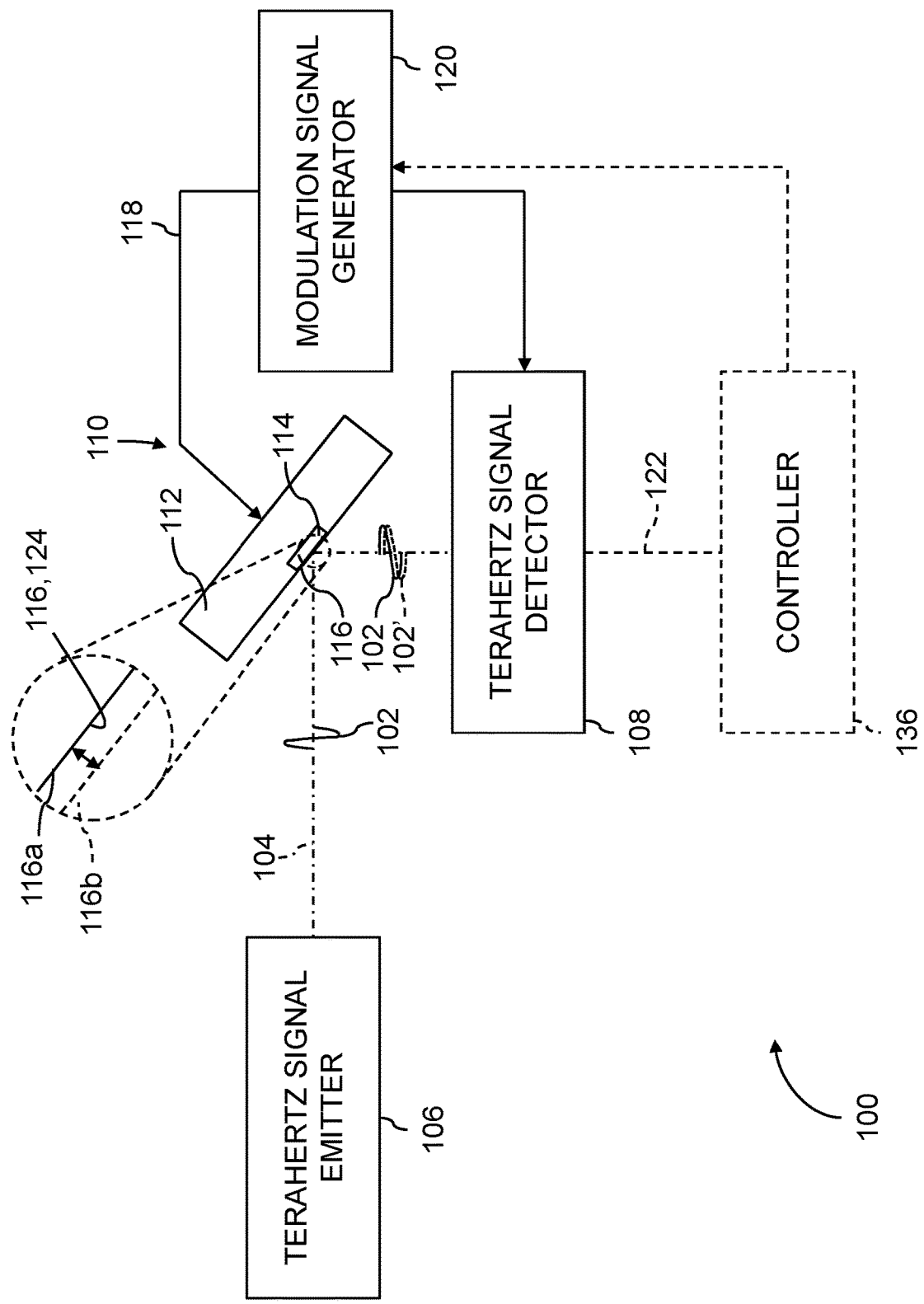
FIG. 1 is a schematic view of an example of a terahertz modulation system, showing a terahertz signal emitter, a modulation unit, a terahertz signal detector and a controller, in accordance with one or more embodiments.

FIG. 1 shows an example of a terahertz modulation system 100 for modulating a terahertz signal 102. In this disclosure, a terahertz signal is defined as a signal comprising electromagnetic radiation having terahertz frequencies, usually defined as 0.1 to 10 THz, preferably between 100 GHz and 1 THz, and most preferably of about 230 GHz. As such, the terahertz radiation lies at the far end of the infrared band, just after the end of the microwave band, and corresponds to millimeter and submillimeter wavelengths between 3 mm and 0.03 mm. The terahertz signal 102 can comprise one or more terahertz pulses, in some embodiments. The term "terahertz" is meant to be interpreted broadly so as to encompass frequencies lying near the commonly accepted boundaries of the terahertz region of the electromagnetic spectrum.

As depicted, the terahertz modulation system 100 has a path 104 extending between a terahertz signal emitter 106 and a terahertz signal detector 108. A modulation unit 110 is disposed at some position along the path 104, downstream from the terahertz signal emitter 106 and upstream from the terahertz signal detector 108. The terahertz signal emitter 106 can be a coherent pulse emitter or a coherent continuous-wave (CW) emitter. In this example, the terahertz signal emitter 106 emits the terahertz signal 102 along the path 104, the modulation unit 10 modulates at least a portion of the terahertz signal 102, after which at least the modulated portion 102' of the terahertz signal 102 is detected by the terahertz signal detector 108.

More specifically, as shown in this example, the modulation unit 110 has a substrate 112 and an electromechanical transducer 114 actuatably mounted to the substrate 112 and having a resonance frequency at which a resonant phenomenon can be observed. The resonance frequency can generally be range between the kilohertz range and the megahertz range, as would be expected from ultrasound transducers. The electromechanical transducer can be any type of electromechanical transducer including, but not limited to, a piezo electric transducer, an electrostatic transducer and the like. The electromechanical transducer 114 has a terahertz interacting surface 116 receiving the terahertz signal 102 and moving in resonance between first and second positions 116a and 116b relative to the path 104 upon actuation with a modulation signal 118 at the resonance frequency, thereby modulating at least the portion 102' of the terahertz signal 102. In some embodiments, the modulation signal 118 is generated using a modulation signal generator 120 such as an electrical waveform generator.

As shown, the terahertz signal detector 108 is synchronized with the resonance frequency using the modulation signal 118. It was found convenient that the terahertz signal detector 108 be phase sensitive. Accordingly, the terahertz signal detector 108 synchronously measures the modulated portion 102' of the terahertz signal 102, after which a differential signal 122 indicative thereof is generated.

The terahertz modulation system 100 described with reference to FIG. 1 is operated in a reflection configuration in which the terahertz interacting surface 116 is a terahertz reflecting surface 124. However, in some other embodiments, the terahertz modulation system can be operated in a transmission configuration, an example of which is described at FIG. 5.

Figure 2:
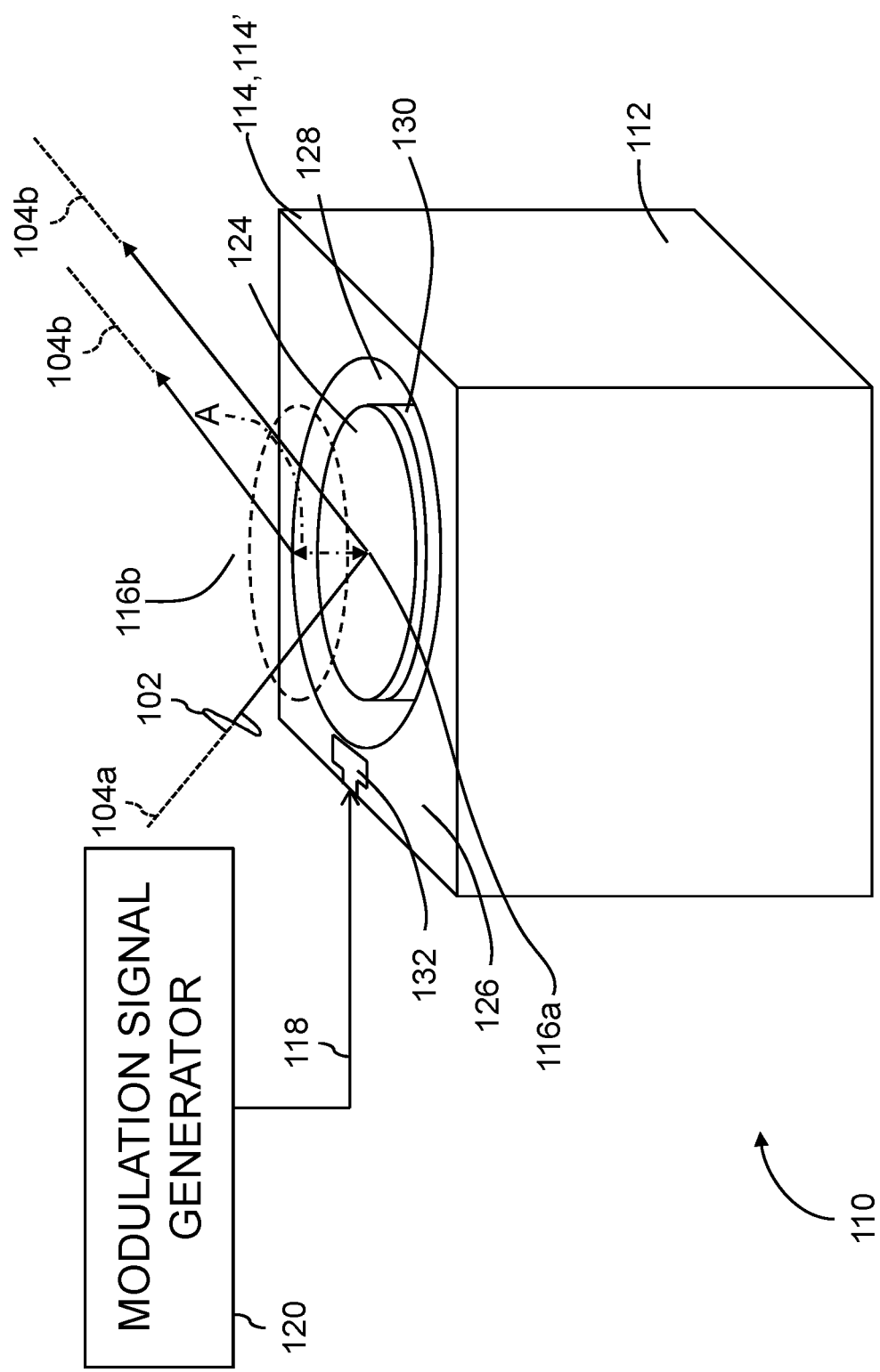
FIG. 2 is an oblique view of a portion of the modulation unit of FIG. 1, showing an electromechanical transducer, in accordance with one or more embodiments.

Referring now to FIG. 2, an enlarged view of the electromechanical transducer 114 is shown. More specifically, in this example, the electromechanical transducer 114 is provided in the form of a piezoelectric transducer 114'. As can be appreciated, the terahertz reflecting surface 124 receives the terahertz signal 102 from an upstream portion 104a of the path 104 and reflects it towards a downstream portion 104b of the path 104. The angle of the reflection can depend from one embodiment to another. In some embodiments, such as the one described below with reference to FIG. 6 and following, one or more terahertz reflecting elements such as mirrors can be used upstream and/or downstream from the modulation unit 110, e.g., to avoid any movement of the downstream portion 104b of the path 104 as the terahertz reflective surface 124 moves between the first and second positions 116a and 116b.

As shown in this example, the piezoelectric transducer 114' has an annular insulating member 126 which is received on the substrate 112 and which defines a cylindrical cavity 128 therein. A conductive disk 130 is received in the cylindrical cavity 128 and is also axially movable within the cylindrical cavity 128. In this embodiment, the conductive disk 130 has the terahertz reflecting surface 124. For instance, in some embodiments, the conductive disk 130 can be made of a conductive material which reflects terahertz radiation such as aluminum or any other suitable conductive metal or alloy, in which case the terahertz reflecting surface 124 is made integral to the conductive disk 130. It is intended that the piezoelectric transducer 114' can be actuatable by supplying the modulation signal 118 to a conductive terminal 132 mounted on the annular insulating member 126 next to the cylindrical cavity 128. When so-actuated, the conductive disk 130 axially moves in back and forth sequences, between the first and second positions 116a and 116b, along the axis A of the cylindrical cavity 128. The piezoelectric transducer 114' can be provided in any suitable type, shape or form depending on the embodiment. For instance, in some embodiments, the piezoelectric transducer 114' can be a conventional ultrasonic probe which inherently reflects terahertz signals or which is modified to reflect terahertz signals. In the latter example, the conventional ultrasonic probe may be modified by depositing conductive material such as metal on the moving part of the conventional ultrasonic probe.

Referring back to FIG. 1, it was found that the differential signal generated by the terahertz radiation detector 108 is indicative of a difference between the terahertz signal reflected by the terahertz reflecting surface 124 at the first position 116a and the terahertz signal reflected by the terahertz reflecting surface 124 at the second position 116b over a given period of timeΔt. The difference thereby indicates a rate of change of the terahertz signal over the period of time. The concept behind such differential findings is discussed below with reference to FIG. 14.

The spatial difference between the first and second positions of the terahertz reflecting surface 124 is referred to as the piezoelectric displacement (PD), and can range between 100 nm to few microns. For instance, with a piezoelectric displacement of 1 micron, the electromechanical transducer would induce a round trip of light of 2 microns. As 1 micron in space corresponds to 3.33 fs time at light speed (c, speed of light of 299 792 458 m/s in vacuum), a piezoelectric displacement of 1 micron would induce a change in the terahertz signal of 6.66 fs, with $\Delta t = (PD \times 2)/c$.

The terahertz modulation system 100 can have a controller 136. In this example, the controller 136 can have a processor and a memory having instructions stored on the memory that when executed by the processor performs pre-programmed steps. For instance, the controller 136 can perform a step of determining an indication of the terahertz signal 102 and/or of the modulation signal 102' by integrating the generated differential signal 122 over the period of time Δt. It was found advantageous, in at least some circumstances, to retrieve the original signal by integrating the differential signal 122 in this manner. For instance, the so-retrieved signal may have a greater spectral content than if the original was measured directly in the first place.

Figure 3:
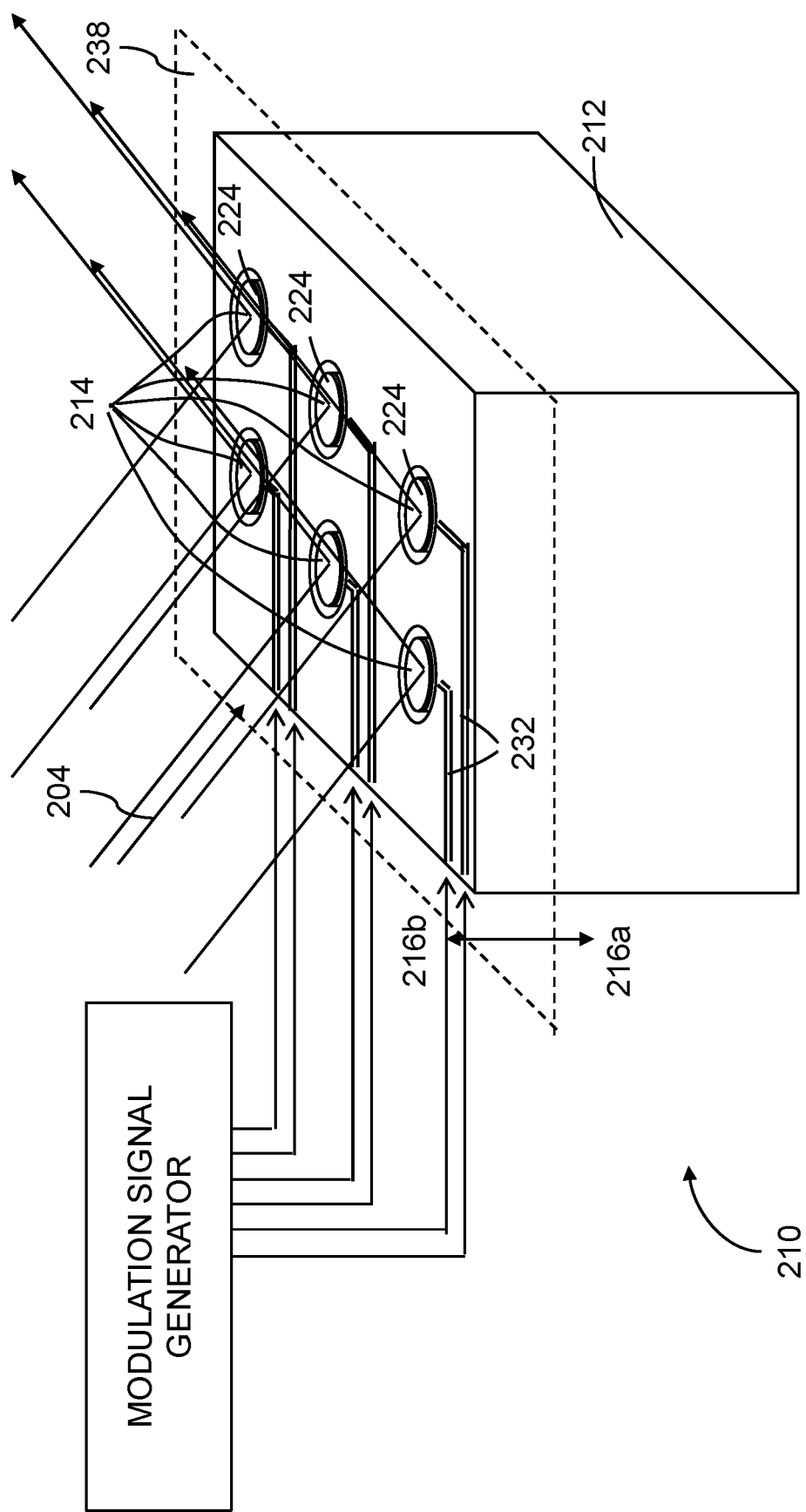
FIG. 3 is an oblique view of another example of a modulation unit, with a plurality of electromechanical transducers, in accordance with one or more embodiments.

In some embodiments, the modulation unit 110 can have more than one electromechanical transducer 114. Reference is now made to FIG. 3 which illustrates another example of a modulation unit 210. As shown, the modulation unit 210 has a plurality of electromechanical transducers 214 distributed on the substrate 212.

In embodiments where the electromechanical transducers 214 all share a common resonance frequency, the electromechanical transducers 214 may be actuatable with a single modulation signal at the common resonance frequency. In these embodiments, the conductive terminals of each electromechanical transducer 214 may be electrically connected to one another. However, in some other embodiments such as the one shown in FIG. 3, the electromechanical transducers 214 may have respective and independent conductive terminals 232. In these embodiments, if the electromechanical transducers 214 are actuated with the same modulation signal, the terahertz reflecting surfaces 224 of the electromechanical transducers 214 can form a plane 238 moving in resonance between the first and second positions 216a and 216b relative to the path 204. By doing so, a larger portion of the incoming terahertz signal may be modulated at the same time.

Otherwise, the electromechanical transducers 214 may be actuated with modulation signals at the resonance frequency but out of phase with one another so that the terahertz reflecting surfaces 224 move independently from one another, as dictated by the phase of their respective modulation signals. Such actuation can be preferred in application where spatial modulation is sought. In alternate embodiments, the electromechanical transducers 214 may have different resonance frequencies as well.

The controller discussed above with reference to FIG. 1 can be provided as a combination of hardware and software components. The hardware components can be implemented in the form of a computing device 400, an example of which is described with reference to FIG. 4. Moreover, the software components of the controller can be implemented in the form of a software application (not shown).

Figure 4:
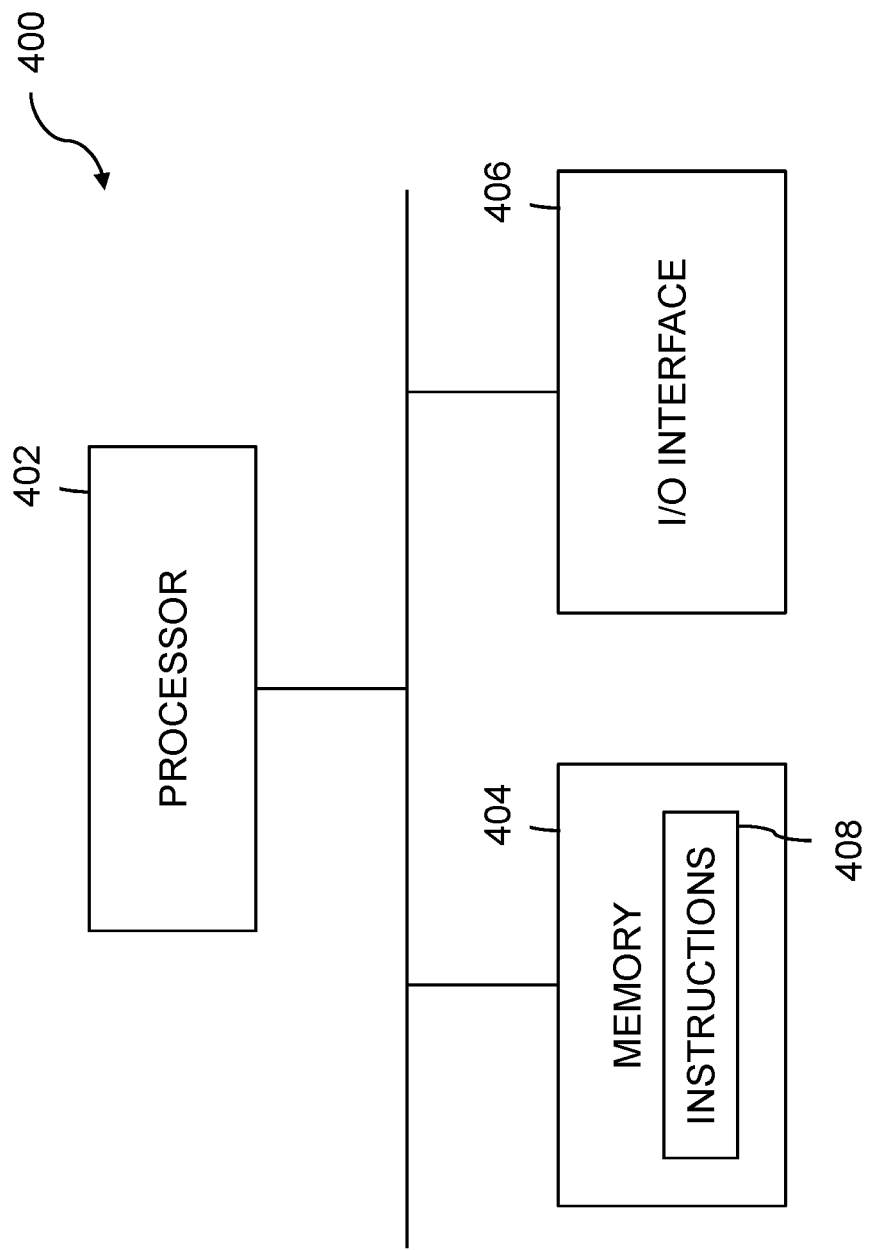
FIG. 4 is a schematic view of an example of a computing device of the controller of FIG. 1, in accordance with an embodiment.

Referring to FIG. 4, the computing device 400 can have a processor 402, a memory 404, and I/O interface 406. Instructions 408 for processing the differential signal can be stored on the memory 404 and accessible by the processor 402.

The processor 402 can be, for example, a general-purpose microprocessor or microcontroller, a digital signal processing (DSP) processor, an integrated circuit, a field programmable gate array (FPGA), a reconfigurable processor, a programmable read-only memory (PROM), or any combination thereof.

The memory 404 can include a suitable combination of any type of computer-readable memory that is located either internally or externally such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like.

Each I/O interface 406 enables the computing device 400 to interconnect with one or more input devices, such as the terahertz signal detector, keyboard(s), mouse(s), or with one or more output devices such as monitor(s), user interface(s), memory(ies), network(s).

Each I/O interface 406 enables the controller of FIG. 1 to communicate with other components, to exchange data with other components, to access and connect to network resources, to serve applications, and perform other computing applications by connecting to a network (or multiple networks) capable of carrying data including the Internet, Ethernet, plain old telephone service (POTS) line, public switch telephone network (PSTN), integrated services digital network (ISDN), digital subscriber line (DSL), coaxial cable, fiber optics, satellite, mobile, wireless (e.g. Wi-Fi, WiMAX), SS7 signaling network, fixed line, local area network, wide area network, and others, including any combination of these.

The computing device 400 described above are meant to be examples only. Other suitable embodiments of the controller of FIG. 1 can also be provided, as it will be apparent to the skilled reader.

Figure 5:
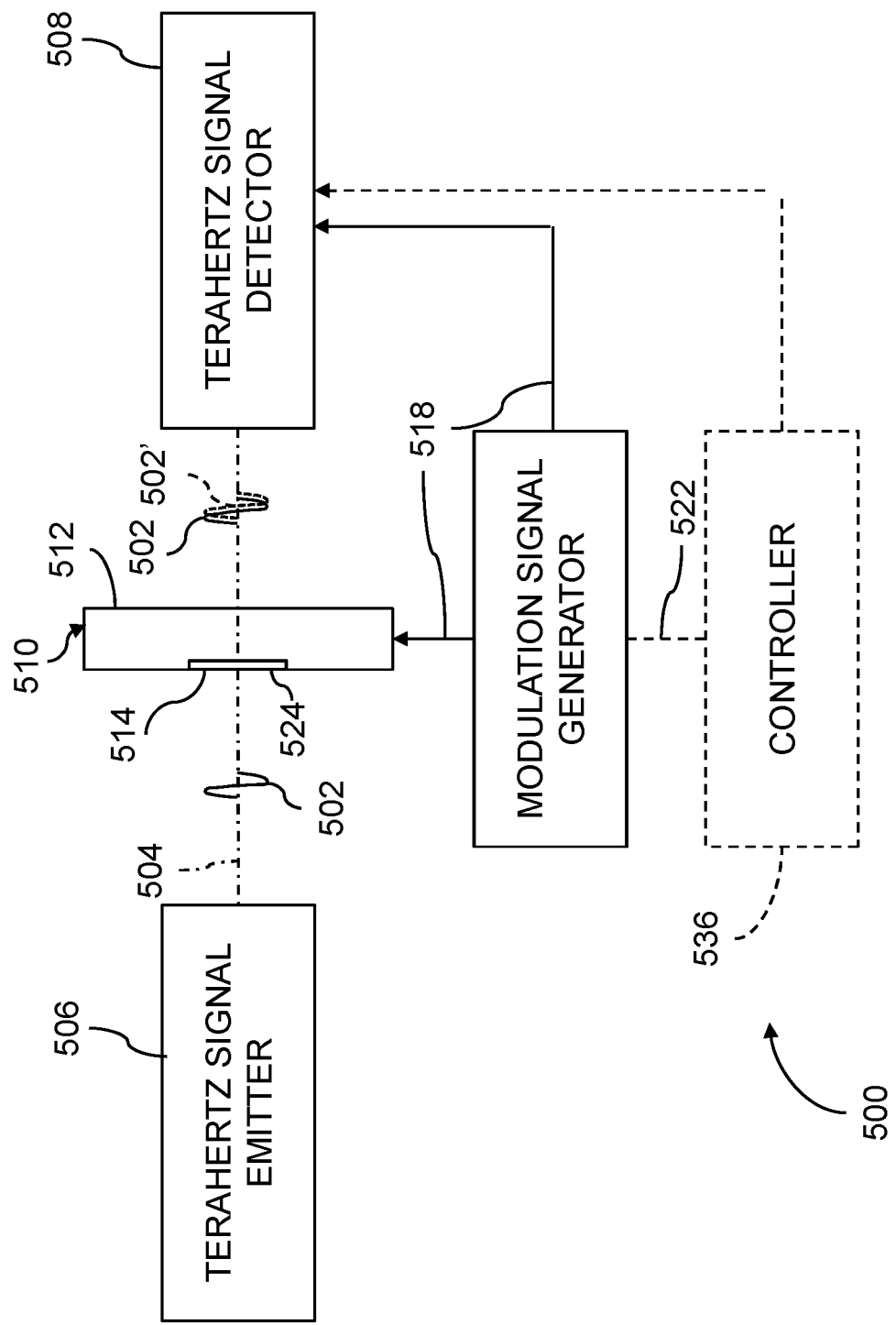
FIG. 5 is a schematic view of another example of a terahertz modulation system, with a modulation unit operable in a transmission configuration, in accordance with one or more embodiments.

FIG. 5 shows another example of a terahertz modulation system 500. As shown, the terahertz modulation system 500 has a terahertz signal emitter 506 emitting a terahertz signal 502 along a path 504. A modulation unit 510 is disposed in the path 504. The modulation unit 510 has a substrate 512 and an electromechanical transducer 514 actuatably mounted to the substrate 512. The electromechanical transducer 514 has a terahertz transmissive surface 524 receiving the terahertz signal 502 along the path 504 and moving in resonance between first and second positions relative to the path 504 upon actuation with a modulation signal 518 at a resonance frequency of the electromechanical transducer 514, thereby modulating at least a portion 102' of the terahertz signal 502. The terahertz modulation system 500 has a terahertz signal detector 508 downstream from the modulation unit 510 along the path 504. As such, the terahertz signal detector 508 is synchronized with the resonance frequency using the modulation signal 518 and synchronously measures the modulated portion 102' of the terahertz signal 102, and generating a differential signal 522 indicative thereof.

In such a transmission configuration, the terahertz signal emitter can be a coherent pulsed emitter or a coherent CW emitter. It was found convenient to use terahertz signal detectors which are phase sensitive in this embodiment.

Example 1—Active Terahertz Differentiator Using Piezoelectric Micro Machined Ultrasonic Transducer Array The success of the rapid growth of information technology is closely linked to the ability to modulate and demodulate a signal, whether in the frequency or in the time domain. This essential step allows the multiplexing of information as well as its portability to different media. For electromagnetic radiations in the terahertz (THz) frequency range, this critical element is part of an active research area with enormous potential for the future of telecommunications and ultra-fast sensing. Recent demonstrations of THz modulation involve active semiconductor metamaterial surfaces or use a grating-based micro mirror for frequency offset tuning. However, a wideband and active differentiator in the THz frequency band is yet to be demonstrated. In this example, a simple method is proposed to differentiate a THz pulse by inducing tiny phase changes on the THz beam path using a piezoelectric micro machined ultrasonic transducers array. It is demonstrated in this example that the THz signal detected after the piezoelectric device is proportional to the first-order derivative of the THz pulse. The proposed technique will be able to support a wide range of THz applications, from edge detection for imaging to peak detection schemes for telecommunication systems, in addition to improving the sensitivity of THz spectroscopic methods. Furthermore, as it is a matrix modulator in which each transducer is electronically controllable, the development of new spatiotemporal computational information retrieval in the THz frequency range is highly anticipated.

Modulators are the key to success in advancing information technology in terms of speed and efficiency. Undeniably, in the context of the ever-increasing demand for telecommunications bandwidth, research activities focused on designing and implementing new and efficient modulators are not about to slow down. For optical communications, the last decade has witnessed the achievement of critical modulation functions to overcome the severe speed limitations imposed by an electronics-based system. In particular, optical differentiator schemes that perform the time derivative of the field envelope of an optical signal are mandatory in processing ultrahigh-bit-rate optical communication signals. In the near-infrared range (NIR), this operation is generally done using various schemes, such as fiber grating, temporal lensing, and electro-optic effects. At the same time, the spatial differentiation function is a common operation in digital image processing for edge detection. For example, this operation can be achieved optically using plasmonic response at the metal-dielectric interface, as well as by guided resonances in photonic crystal slabs. Although many of these approaches are well established in the manipulation of the optical beam, they still remain to be demonstrated in the THz frequency band (i.e., from 0.1 THz to 10 THz). The arrival of THz waves in the telecommunications world is eagerly awaited. Consequently, the demand for a differentiation device to identify the high-frequency component of a signal, such as peak detection, will be a necessary tool to respond to future real-time, high-speed information processing. At the same time, with the unique properties of THz waves to penetrate visibly opaque materials, there is an increasing demand for THz imaging applications and research activities, and an image differentiation function may be needed to improve image rendering.

Significant efforts have been invested in achieving the analogue modulation of THz waves. For example, micro mirror array grating-based and THz metasurfaces, which are based on various functional materials, such as photo excited semiconductors, liquid crystal and graphene, which have provided several modulation types: frequency tuning, amplitude modulator, phase modulator, and polarization control. Although a few attempts have been made to introduce temporal and spatial differentiators, none of them work dynamically in the time and/or space domain, i.e., with an external control signal, which is required to efficiently couple information from an electronic signal to THz radiation.

In this example, there is proposed a differentiator using an 8×8 piezoelectric micro machined ultrasonic transducers (PMUT) array excited at its resonant frequency to realize a first-order temporal differentiation in the THz region. The PMUT array is generally used for ultrasonic transducers. Here, each unit cell acts as a single micro mirror to modulate the full THz bandwidth in the time domain. The piezo resonance is excited by an external single-frequency electric field, which induces an up and down translation of each unit cell, allowing tiny temporal (i.e., at the femtosecond timescale) variations in the THz beam path. Using a lock-in detection referenced on the piezo resonance frequency allows undertaking a differential measurement. The characteristics and functionality of the PMUT are first described.

Then, it is demonstrated that the lock-in detection of THz pulses at the PMUTs resonant frequency is proportional to the first-order derivative of the incident THz pulse. Third, the effect of PMUT amplitude motion on the derivative signal behavior is evaluated. Based on these observations, a limit at which microelectromechanical devices can act as differentiators for THz waves is suggested.

FIG. 6A shows the PMUT array. It covers an area of 4.3×4.3 mm$^2$ on a 0.4-mm-thick Silicon-on-insulator (SOI) wafer substrate. The array is built with 8×8 PMUTs with a 500 μm lattice pitch in both directions. A unit cell of the PMUT array (FIG. 6B) consists of a cylindrical SOI wafer and a piezoelectric structure. The piezo structure has a 200 μm diameter, with a 500 nm thick piezoelectric layer (aluminum nitrite) sandwiched between two electrode layers. The electrodes are composed of a 1 μm thick aluminum layer on top and 10 μm thick silicon layer at the bottom, as shown in FIG. 6B. The piezo structure is suspended in the hole of the cylindrical wafer to allow up and down displacement, as illustrated in FIG. 6D.

FIGS. 7A-C show a visualisation of the piezoelectric micro machined ultrasonic transducer (PMUT) array using scanning electron microscopy (SEM). As shown in FIG. 7A, the arrangement of the PMUTs is linearly spaced with a distance of 500 μm. FIG. 7B shows a view of a single PMUT with the indication of two electrodes for signal and ground. In this figure, one can clearly see the anchoring of a single PMUT. In FIG. 7C, a detailed view of the anchorage is shown and of where the signal is taken, in which all layers used in the manufacture of the PMUT are clearly identified. The PMUT device is a free standing 200 μm diameter silicon membrane anchored using 4 arms of 20 μm width and 30 μm length. The silicon membrane acts as the bottom electrode and is covered by a layer of Aluminum Nitride (AlN) acting as the active material. The AlN layer is covered by an aluminium layer acting as the top electrode.

Figures 8A, 8B, 8C, 8D, 8E, 8F:
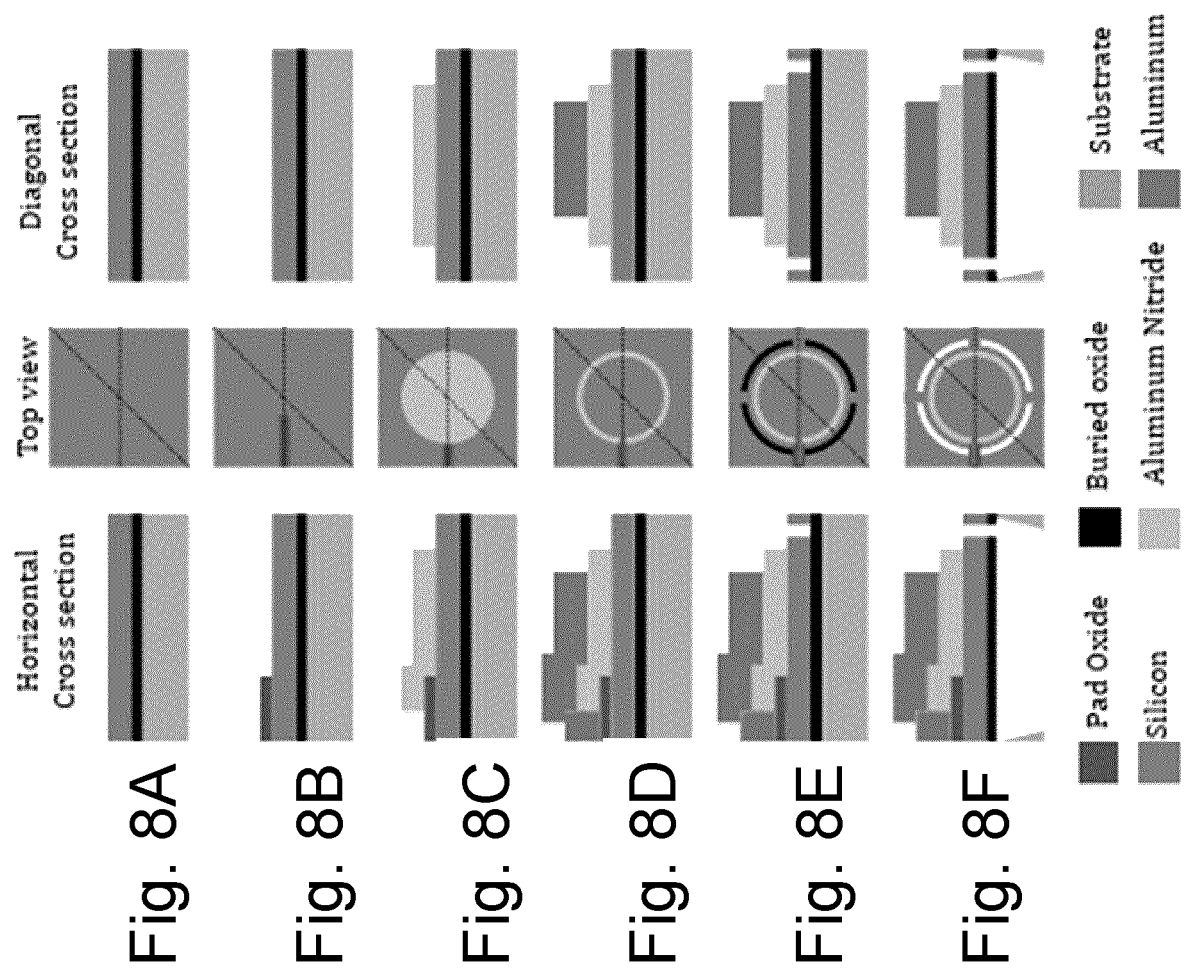
FIG. 8A shows an horizontal cross-sectional view (left-hand figure), a top view (middle figure) and a diagonal cross-sectional view (right-hand figure) of a silicon-on-insulator (SOI) substrate on which the PMUT are manufactured, in accordance with one or more embodiments.
FIGS. 8B-F show horizontal cross-sectional views (left-hand figure), top views (middle figure) and diagonal cross-sectional views (right-hand figure) of the SOI substrate of FIG. 8A during manufacturing steps of the PMUT, in accordance with one or more embodiments.

The PMUT array was fabricated using the commercial Piezo, Multi-User MEMS Processes, (MUMPS) process and the fabrication steps are illustrated in FIGS. 8A-F. The process starts with using a SOI wafer composed of a 400 μm thick silicon layer, a 400 nm thick insulator layer and a 10 μm thick silicon layer (FIG. 8A). Electrical conduction is achieved by doping the substrate followed by the thermally growing of a 200 nm thick pad oxide layer (FIG. 8B) by photolithography. This step allows electrical insulation in between the two electrodes. Afterward, a 500 nm aluminium nitride, AlN, layer is deposited as a piezoelectric material by sputtering (FIG. 8C). The top electrode is created by the deposition and the pattered of an aluminum layer with thickness of 1 μm and 180 μm diameter (FIG. 8D). Later, the silicon device layer is etched by Deep Reactive-Ion Etching (DRIE), resulting in a circular silicon membrane of 200 μm diameter (FIG. 8E). The diameter of the silicon structure is made larger than the aluminium nitride to ensure no overhang of the piezoelectric material. Finally, the membrane is released by etching a trench from the back of the handle wafer by DRIE (FIG. 8F).

Due to the geometry and materials of each element, all PMUTs have almost identical resonant frequencies, with their first and second modes located at 1.38 MHz and 5 MHz, respectively. By applying an external sinusoidal electric field at 1.38 MHz, only the fundamental resonance of the piezo material is excited, and develops an oscillation in the piezo structure. As illustrated in FIG. 6D, the maximum available displacement normal to the substrate plane is around ±50 nm, for a total round trip of 100 nm. It should be mentioned that this magnitude of displacement is not high enough to induce a curvature on the aluminum surface during the resonant motion at 1.38 MHz, and thus a flat surface motion is assumed. Finally, to allow interconnection with an electronic controller, the PMUT array is mounted on a gold leadless chip carriers (LCC) packaging with a 12×12 mm$^2$ area (see FIG. 6E).

To test the capacity of the PMUT array to modulate THz signals, a standard time domain THz spectrometer with photoconductive antennas (PCA) was used. FIGS. 9A and 9B show the experimental configuration without and with the PMUT array, respectively. An ultrafast Ti: Sapphire oscillator laser at an 80 MHz repetition rate with a central wavelength at 805 nm and pulse duration of 30 fs was used to pump two LT-GaAs PCAs (from Teravil Ltd.) for the emission and detection of THz waves. The average pumping powers are set to 25 mW and 20 mW for the emitter and detector, respectively. The hemispherical Si lens on the back of the emitter and detector provides a collimated THz beam approximately 12 mm in diameter. Therefore, no focusing optics were used in this demonstration; rather, only 2-inch diameter copper mirrors with bare gold coatings on top, denoted M in FIGS. 9A and 9B, were used. To work in reflection geometry, the mirror M2 is replaced with the device under test, as illustrated in FIG. 9B. FIGS. 9C and 9D shows the THz traces obtained with the experimental configuration shown in FIGS. 9A and 9B, respectively. For these measurements, the lock-in detection is referenced to the emitter modulation frequency, which was set to 25 kHz, i.e., for Mode A operation, as illustrated in FIG. 9A. The inset of FIG. 9C shows the THz spectra of the THz pulse obtained by Fast Fourier transform (FFT) from a highly reflective copper mirror only. In this case, the amplitude signal-to-noise ratio (SNR) with a single scan is above 1000. As observed in FIG. 9D, the THz pulse reflected from the PMUT array exhibits a complex shape when compared to the reflection from the flat surface of M2. This phenomenon is easily explained by the spatial property of the THz beam impinging on the sample, which is collimated, and thus has a beam size larger than the PMUT array. In this and other such cases, the strongest pulse in FIG. 9D, highlighted by the red dotted line, corresponds to that from the PMUT array, whereas the smaller pulses that appear temporally before and after the main signal originate from multiple reflections coming from the LCC packaging.

To study the differentiator function of the PMUT array on the THz wave, in active mode, the reference signal sent to the lock-in amplifier was changed by the fundamental resonance frequency of the piezoelectric material. This operation is illustrated in FIG. 9B, and is hereinafter referred to as Mode B. As shown, the terahertz signal detector includes a terahertz signal detector unit and a lock-in amplifier. More specifically, the terahertz signal detector unit measures an unmodulated portion and the modulated portion of the terahertz signal, and generates a detection signal. The lock-in amplifier thereby receives the detection signal and isolates the modulated portion of the terahertz signal based on the modulation signal. Before investigating the effect of the PMUT motion on the THz beam, the PMUT frequency response was characterized by measuring the transmitted radio frequency (RF) energy (power) using a network analyzer (E5061B Keysight VNA). To identify the resonant frequency, the power transferred (i.e., measured via the S21 scattering parameter) between both electrodes was measured.

A network analyzer is a device with input and output ports which measures the transmitted or reflected power of a signal that passes through the Device Under the Test (DUT).

The measurement of reflected power via scattering parameters S11 and S22 or transmitted power using scattering parameters S21 and S12 can be performed. The measurement is based on transmitted or reflected energy from DUT. The measure of the S parameters allows identification of the resonant frequency of DUT. For example, by transferring alternative power through the DUT, S21 and S12 will experience higher power when DUT is resonating rather than DUT is not resonating. In this example, the average resonant frequency of PMUTs is measured using a Vector Network Analyzer from Keysight, model E5061B with the 64 PMUTs devices in PMUT array are connected in parallel. The resonant frequency of PMUTs is measured via S21 by passing the power between both electrodes of the PMUT array. As all PMUTs are symmetrical result in obtaining equal measurement from reflection parameter S11 and S22. Similarly, the quantity of the transmission parameter S21 and S12 are relatedly comparable.

Figure 10A:
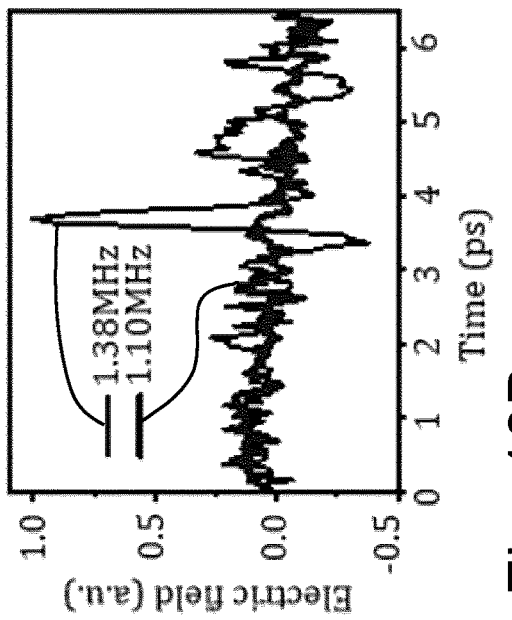
FIG. 10A is a graph showing transmitted power as a function of frequency for the PMUT of FIG. 6A, showing a resonance frequency at 1.386 MHz, in accordance with one or more embodiments.

In FIG. 10A, there is shown the characteristic response of all PMUT arrays as a function of frequency. From that figure, the PMUTs sharply resonate at 1.386 MHz, and can therefore only be excited at a single frequency of 1.38 MHz.

Figure 10B:
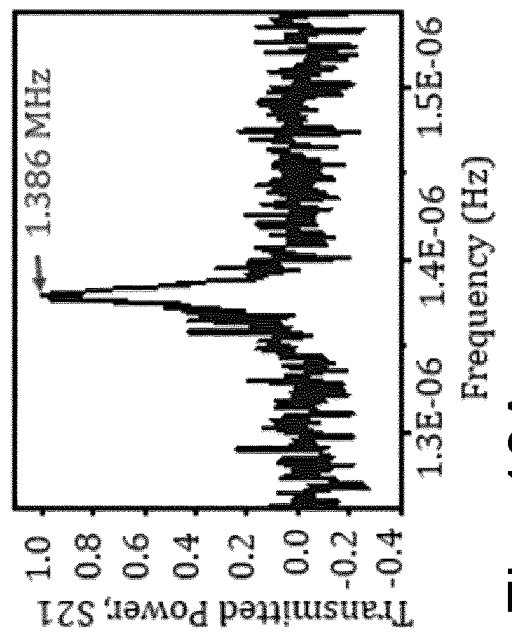
FIG. 10B is a graph showing measured electric field as a function of time for terahertz signals modulated using the terahertz modulation system of FIG. 9B with modulation signals on and off the resonance frequency, in accordance with one or more embodiments.
Figure 10C:
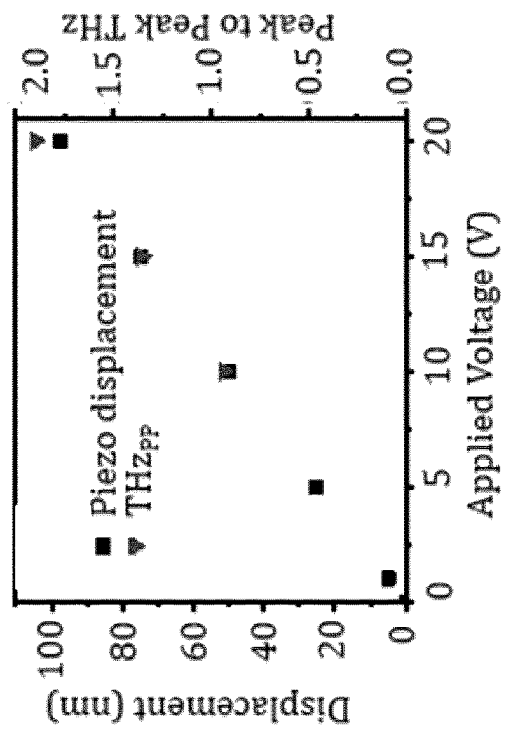
FIG. 10D is a graph showing piezoelectric displacement as a function of modulation signal voltages, in accordance with one or more embodiments.

Since each PMUT operates in the MHz frequency range, a high-frequency lock-in amplifier (model SRR844 from Stanford Research System) was required to perform the lock-in detection with the reference signal at 1.38 MHz in order to investigate the effect of PMUT motions on THz radiation. FIG. 10B shows the measured THz response for 1.38 MHz and 1.10 MHz exciting frequencies of the PMUT array. As expected from the network analyzer, no signal is observed for excitation at 1.10 MHz, i.e., when the device is not oscillating. On the other hand, at a modulation frequency of 1.38 MHz, a tiny THz signal in phase with the modulation of the PMUT array is clearly observed. It is stressed that for this experimental demonstration, the total active area of the PMUTs represents only 3.4% of the total irradiated THz beam size. In addition, since each unit cell of the PMUT array is smaller than the wavelength (i.e., 200 µm in diameter), a strong diffraction of the THz wave may be expected to occur.

Figures 11A, 11B, 12:
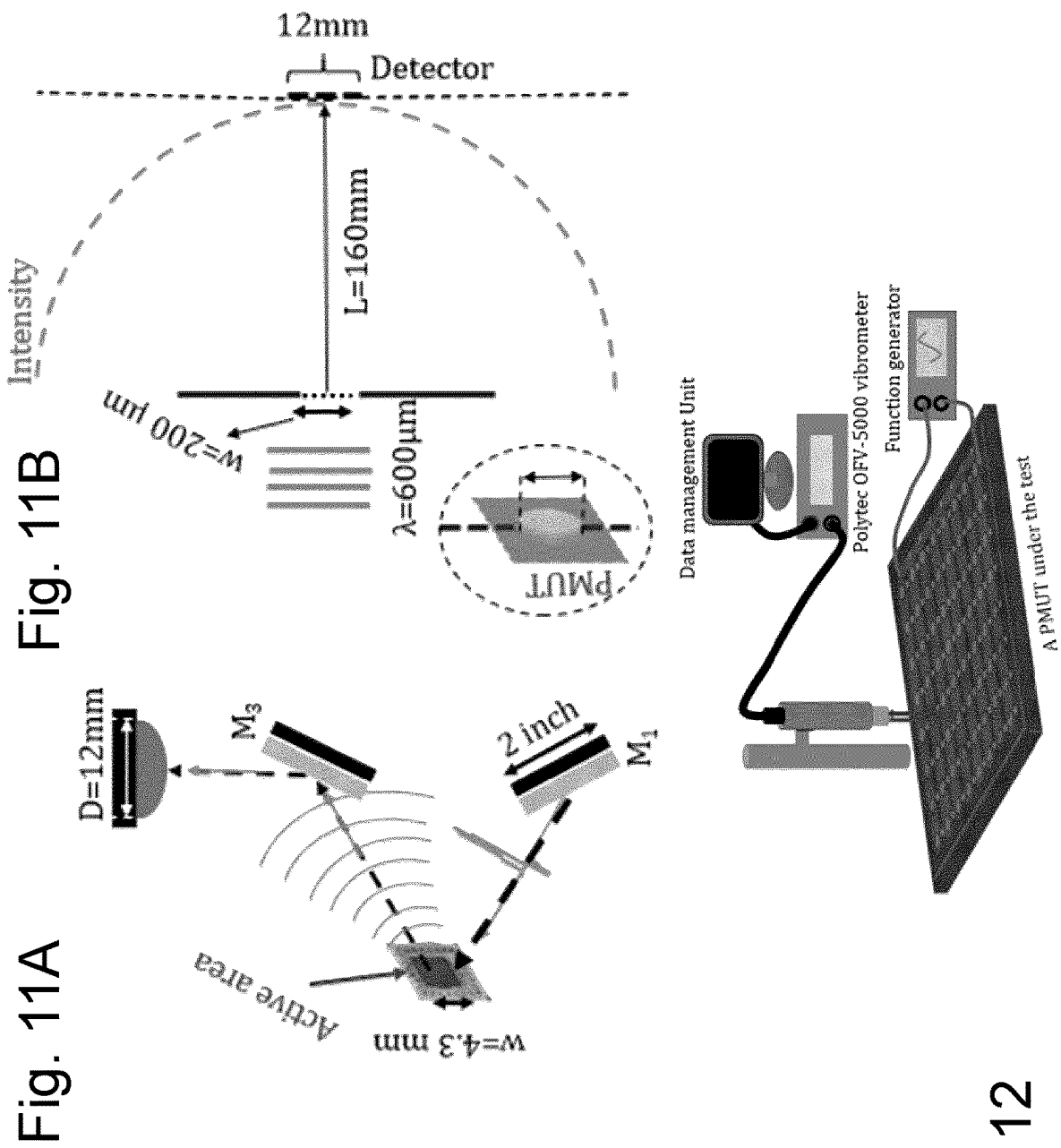
FIG. 11A is a schematic view showing a beam path along which the terahertz signal is propagated, including a first mirror, the modulation unit of FIG. 6A, and a second mirror, in accordance with one or more embodiments.
FIG. 11B is a schematic view showing a terahertz signal impinging on one of the PMUTs of the modulation unit of FIG. 6A, in accordance with one or more embodiments.
FIG. 12 is a schematic view of a system of monitoring the piezoelectric displacement as a function of the modulation signal voltages, in accordance with one or more embodiments.

In the following, the remaining portion of the modulated THz waves was calculated from the total the power reaching the detector. There is interest to evaluate the maximum detected modulated THz power at the detection position. For that purpose, the THz intensity (ITHz) was first estimated from the emitter reaching the PMUT array, with the THz power (PTHz) transferred per unit area (A) (i.e. ITHz=PTHz/A). The emitted THz beam is collimated by a 12 mm in diameter spherical lens and assuming a Gaussian THz irradiation, the half power beam width (HPBVV) falls at 1/e2 of the THz beam's peak irradiance which correspond to a radius of 4.31 mm. Therefore, for the maximum generated THz power of 6 µW and a THz beam area of 58.3 mm² (π×4.312), the intensity at PMUT array position is approximately 100 nW/mm². To estimate the THz modulated power after reflection on PMUT array, the active area covered by the 64 PMUTs was summed up, as illustrated in FIG. 11A. Each PMUT is 200 µm in diameter, with a corresponding active area of 2 mm² for 64 PMUTs (64×π× 0.12). This area over the THz beam area represents only 3.4% of the THz beam irradiance. By multiplying the THz intensity at PMUT position by the active area, a modulated THz power of 200 nW was found.

In addition, since each PMUT (unit cell) as an active area of 200 µm in diameter and assuming a central frequency of around 0.5 THz, as shown in FIG. 9C, the corresponding wavelength of 600 µm indicates large diffraction effect. As predict by the first order diffraction represented by equation S1, it is clear that θ cannot be resolve for this situation, indicating diffraction behavior of a point source.

$$w \sin \theta = m\lambda (S1) \tag{1}$$

where w is the size of one PMUT, λ is wavelength of THz wave (600 µm), and θ the angle at which the first minimum for m=1 is found.

According to a distance of 160 mm, from PMUT to the detector, the surface of half spherical is around 160×103 mm² (2π×160 mm²), as illustrated in FIG. 11B. Then, the corresponding intensity at the detector position is 1.25 µW/mm². Finally, to retrieve the THz power detected, the THz intensity was multiplied by the collecting lens area of detector (i.e. 6 mm radius Si hemispherical lens). This results in a maximum power of 141 µW (1.25 pW/mm²×113 mm²) at the detection position, which represents a ratio of the detected modulated THz power of only 0.0023% of the total transmitted THz power.

Figure 10D:
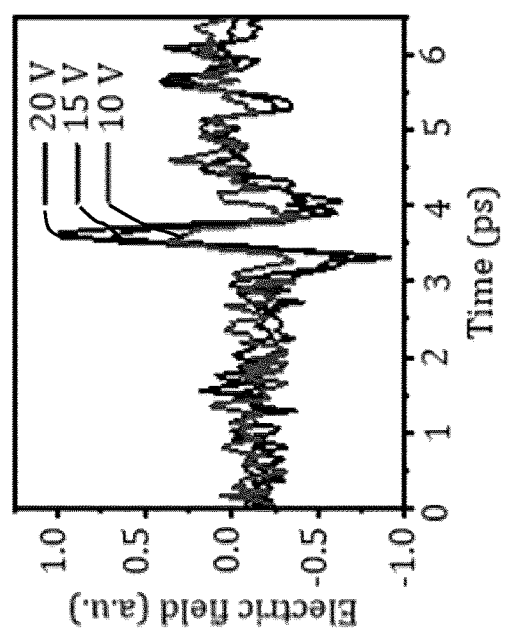

To confirm the effect of the PMUT motion on the detected THz waves, in FIG. 10O, the dependency of the measured THz signal is shown as a function of the PMUT driving voltage at 1.38 MHz. Note that the applied voltage on the PMUT provides proportional changes in the amplitude of the detected differential THz signal. To relate the effect of the absolute motion of the PMUT array to the measured THz signal, FIG. 10D shows the displacement of the PMUT, measured by a vibrometer, and the THz peak-to-peak (pp) electric field, recovered in FIG. 10O, as a function of the control voltage.

Contrary to the network analyzer which measures an electrical response, vibrometer method measures a mechanical response of PMUT. The vibrometer is used to make non-contact vibration measurements of a point using the Doppler effect. It is possible to characterize the amplitude and frequency of a mechanical motion. The laser of the vibrometer was then targeted at the center of a PMUT membrane (as shown in FIG. 12).

Time domain measurements were undertaken using a function generator and a Polytec OFV-5000 vibrometer. The function generator type 33 250A from Agilent is used to provide an electrical excitation to the PMUT (a 1.38 MHz sinusoidal signal with 20 V peak-to-peak amplitude). Then the PMUT transforms this electrical excitation into a mechanical excitation i.e. a displacement. The PMUT only vibrates at this specific frequency which is the mechanical resonance frequency. The amplitude of displacement is linearly proportional to the applied voltage.

Both curves show a linear dependency and overlap each other perfectly. This dependency confirms the active control of the THz response in phase with the PMUT oscillating field and frequency.

In the last step, the signature of the modulated THz wave from the PMUT array was investigated. As the lock-in amplifier is referenced to the resonant frequency of the PMUT array (Mode B described in FIG. 9B), the detected THz signal is simply the subtraction of the electric field by itself shifted by the time path length difference induced by the upper and lower positions of the aluminum membrane of the PMUT array. (see FIG. 6D). As shown in FIG. 10D, for the maximum PMUT displacement of 100 nm, the corresponding roundtrip phase change in the THz beam path is only 0.66 fs. This change is an order of magnitude less than the step resolution of the mechanical delay line of 1 µm and two orders of magnitude less than the sampling resolution, i.e., 53 fs for this experiment. In such a condition, the PMUT motion induces a differential signal response significantly greater than the detected bandwidth of the measured THz pulses. Instead, the difference signal reveals the variations of the THz electric field in Volt/cm/s. Mathematically, this can be expressed by the measured instantaneous slope m of the electric field at a given time t, where:

$$m = \lim_{t \to t_0} m(t) = \lim_{t \to t_0} \frac{f(t) - f(t_0)}{t - t_0} \quad (2)$$

This well-known behavior is at the core of calculus and modern mathematics, the so-called derivative function, and also expressed as dt when $\Delta t$ tends towards zero.

Figure 13A:
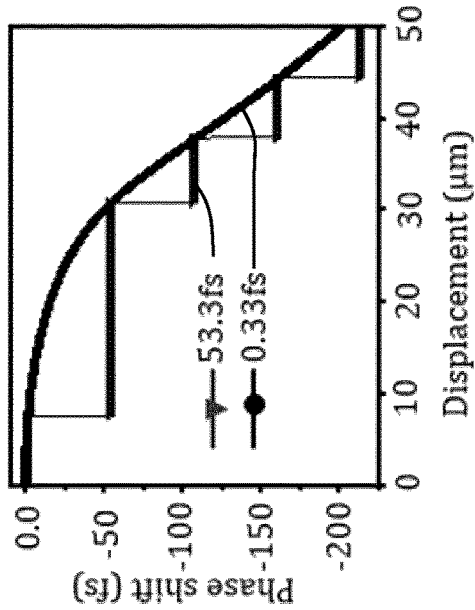
FIG. 13A is a graph showing electric field as a function of time for reference, measured and simulated terahertz signals being modulated with the terahertz modulation system of FIG. 9B, in accordance with one or more embodiments.

In FIG. 13A, the THz wave reflected by the PMUT array is plotted for both modulation types with respect to their absolute time scale: Mode A for emitter modulation (black curve), corresponding to all reflected THz waves on the device when the device is passive, and Mode B for PMUT array modulation (red curve) when the device is active. The blue curve in the same graph represents the calculated first-order derivative of the reflected THz pulse electric field obtained from Mode A (corresponding to dE/dt of the black curve). Strikingly, a perfect match is found between the Mode B signal and the first-order derivative of the Mode A signal (see red versus blue curves), thus confirming the derivative function of the PMUT array.

To evaluate the impact of increased PMUT motion on the derived function, the displacement of the peak position of the derived signal was evaluated as a function of $\Delta t$, which is linearly proportional to the PMUT motion. To do so, a simulated signal with 6.6×10−3 fs resolution was created and its first-order derivative response was calculated.

To evaluate the impact of PMUT motions on the derivative function, a simulated reference signal was created with 6.6×10−3 fs in time resolution. The first-order derivative response of this signal was then calculated as a function of PMUT displacement. To make this evaluation representative to the experimental condition, the slope signal was retrieved only at discrete time frame, e.g., same as in experiment for every 53 fs. FIG. 14 shows the concept of data taking. The motion of the PMUT induces a beam path change for THz waves. This beam path change then induces a temporal variation $\Delta t$. Depending on the motion of PMUT, $\Delta t$ can be a few femtosecond to sub-femtosecond. Lockin detection, such as described above, using motion resonance as a reference can retrieve the difference in signal between the electric fields at the first and second positions, i.e., Et−E$\Delta$t. This difference may be so small, compared with the bandwidth of the terahertz signal, that it can provide the slope directly, such as hinted at equation (2) above. Interestingly, reading the harmonics of the lockin reference signal can provide a direct reading the corresponding derivative signal, with the first harmonic corresponding to the first order derivative (i.e., the slope of the signal), the second harmonic corresponding to the second order derivative (i.e., the acceleration of the signal), the third harmonic corresponding to the third order derivative of the signal (i.e., the rate of acceleration of the signal), and so forth. FIGS. 14A through 14D show example measurements of a terahertz signal and its first four order derivative signals such as measured using the proposed modulation system. Other result of this evaluation is presented in FIG. 15A for some selected displacements; 50 nm, 20 μm, 30 μm, 35 μm and 45 μm. The same calculations are performed for the discrete position every 0.33 fs in FIG. 15B. In these two figures, the reference signal and their first-order derivative calculations are evaluated as a function time delay $\Delta t$ ranging from 0.33 fs to 133.3 fs, also corresponding to 50 nm to 45 μm in PMUT motion respectively. In FIGS. 15A and 15B, as $\Delta t$ increase, a clear shift of the peak position of the derivative signal towards negative time is observed. This information on phase shift is summarized in FIG. 13B of the main document.

To have an idea of the phase shift impact on the experimental data, FIG. 15C shows the integration of the calculated derivative signals of FIG. 15B and compared them with the reference signal. Note that the reference signal was made with the same THz bandwidth as the experimental one, i.e., from 0.1 to 4.0 THz. It is clear that the recovered THz signal from derivative one is highly dependent on PMUT motions. Finally, to estimate the amplitude spectra dependency of the recovered signal as function of PMUT array motions, the amplitude spectra was obtained by Fast Fourier Transform (FFT) of the integrated signals calculated in FIG. 15B. From that figure, it can be confirmed that the PMUT motion use in our experiment of 100 nm does not induce any change in the spectral-domain, which confirm the broadband ability to induce phase change on a THz signal with this novel modulator.

Figure 13B:
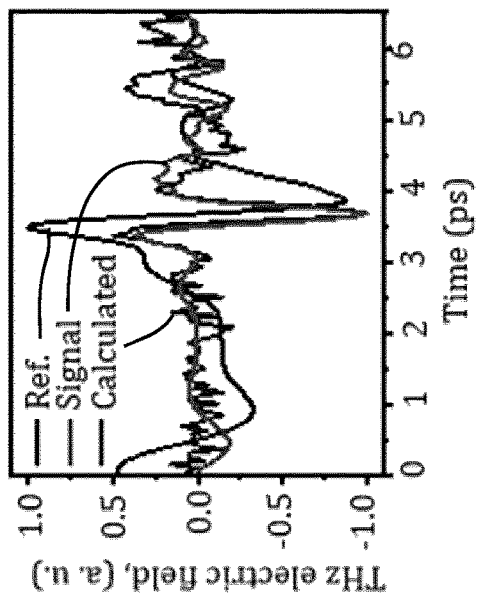
FIG. 13B is a graph showing phase shift as a function of piezoelectric displacement for different discrete timing positions, in accordance with one or more embodiments.
Figure 13C:
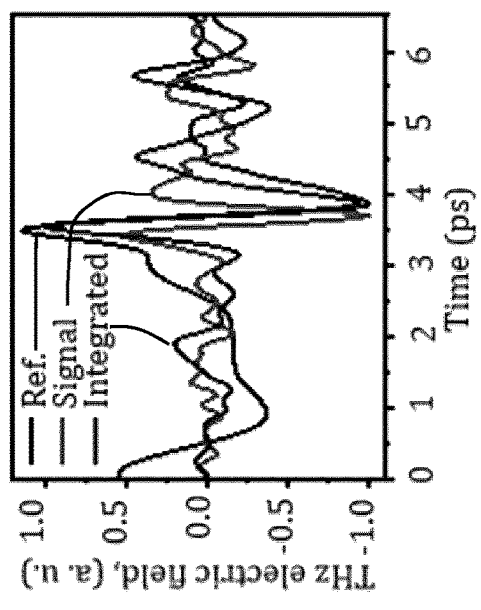
FIG. 13C is a graph showing amplitude as a function of frequency showing terahertz signals recovered from integrating the signals shown in FIG. 13B, in accordance with one or more embodiments.
Figure 14:
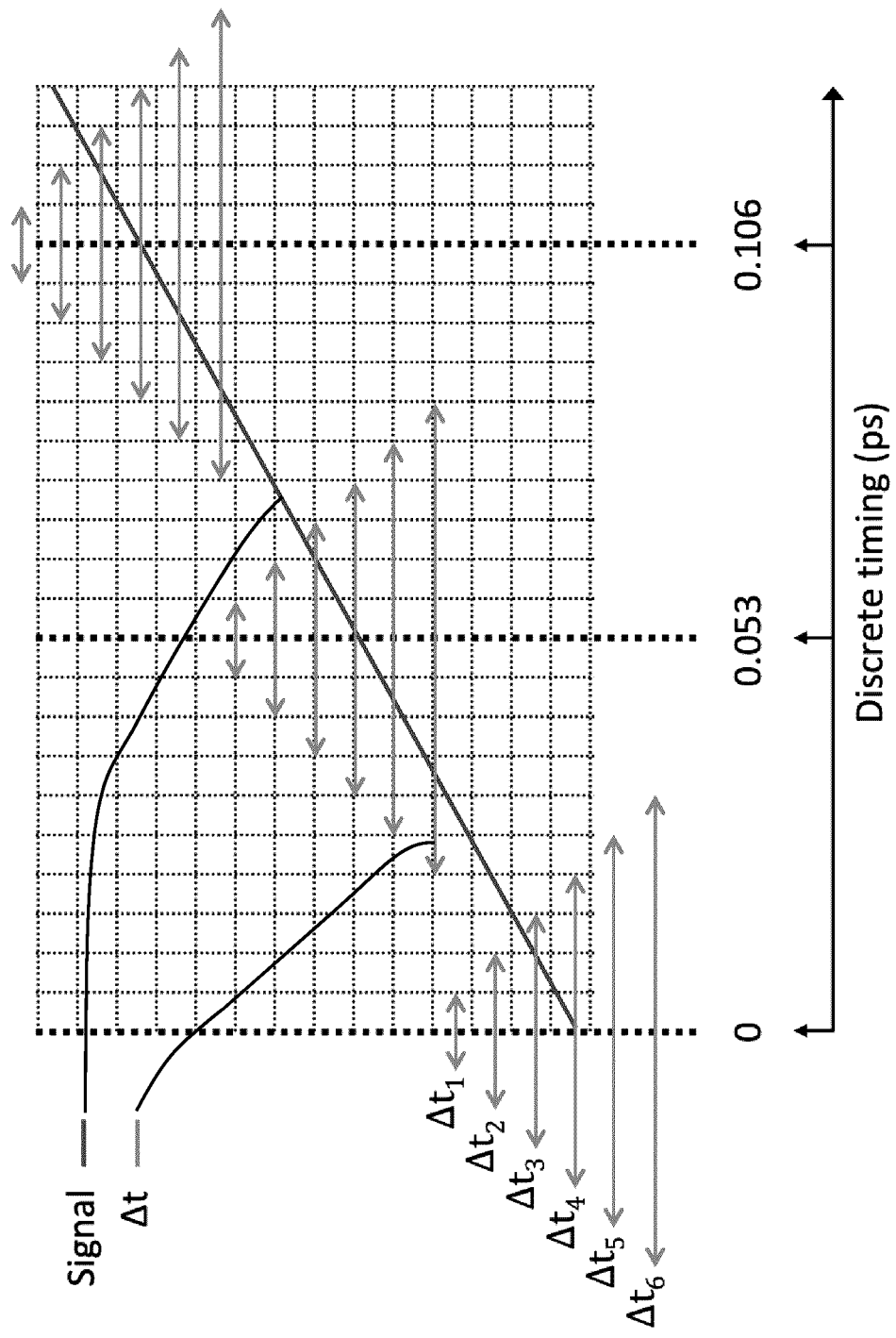
FIG. 14 is a schematic view illustrating the differentiation principle, showing that the PMUTs of FIG. 6A induce a terahertz beam path change proportional to temporal size Δt, in accordance with one or more embodiments.

In FIG. 13B, the black and blue curves represent the phase shifts of the peak value of the derived signal differentiated at a discrete timing (corresponding to the sampling time of our mechanical delay line) position for 0.33 fs and 53.3 fs, respectively. In this graph, for PMUT array motions below 1 μm, it is clear that no significant phase shift occurs for both cases, implying purely derivative behavior. However, using the same discrete timing as in the experiment (e.g., 53.3 fs), motions between 10 μm and 30 μm introduce a sudden phase shift of the peak position in the order of the sampling timing, i.e., 53 fs. To further investigate the impact of PMUT array motion, the different derivative curves were integrated used in FIG. 13B to recover their spectral content. In FIG. 13C, the amplitude spectra dependency of recovered signal is shown as a function of PMUT array motions. Interestingly, for motions of 5 μm and less, the spectral content remains almost unchanged in the 0 to 3 THz range, and are gradually affected by low pass filtering from the larger $\Delta t$. In principle, to avoid losing the high frequency component of the THz information, phase shifts that are at least two times smaller than the sampling timing should be considered. This would ensure satisfying the Nyquist theorem, which is highly respected in our demonstration.

Figure 13D:
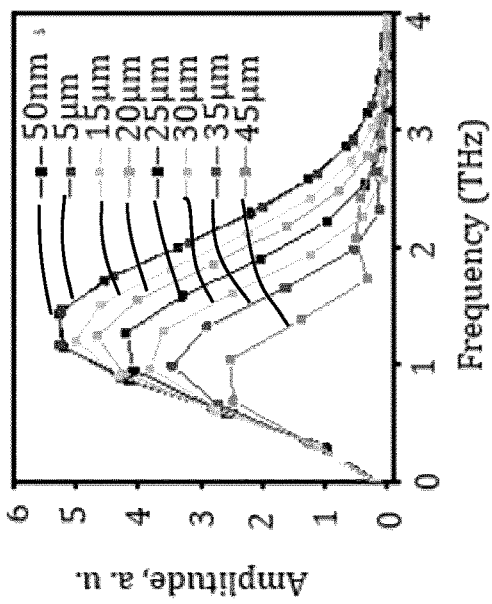
FIG. 13D is a graph showing electric field as a function of time for terahertz signals recovered from integrating modulated portions of the terahertz signal measured using terahertz modulation system of FIG. 9B, in accordance with one or more embodiments.

In FIG. 13D, there is interest in recovering the original signal from the derivative information. Similarly, integrating the derivative measurements from Mode B does exactly that. Although the derivative of a signal is sensitive to fast oscillations (such as noise), the integration is affected by the level of offset. Therefore, care must be taken before integrating the derivative information. Here, before the signal was integrated, the zero-frequency component and high frequency noise of the derived signal were removed in the spectral domain and then performed inverse Fourier transforms back into the time domain. As shown in this figure, the recovered THz signal contained only de-modulated information, without the signal reflected from the LCC packaging, as intended for this experimental demonstration.

In view of the aforementioned, a simple method to actively modulate THz waves in reflection mode using a PMUT array as a differentiator was demonstrated and described above. This modulator makes it possible to carry out the fundamental mathematical operation of differentiation, i.e., supplying an output proportional to the derivative of the input. Such differentiators are highly anticipated for the future of data transmission in THz telecommunications and for novel THz imaging methods. Derivation could be also of interest for spectroscopy because it allows spectral information to be shifted from low to high frequencies or to quickly identify the rate of change of the THz signal. Future work will include the active function of PMUT array in performing computational imaging from the derivative signal, which should provide images with enhancements of high frequency components. Our result confirms the merit of microelectromechanical devices for manipulation and control of THz waves and suggests the use of PMUTs with larger motions to improve sensitivity performance, which are already available.

Example 2—Terahertz Time-Domain Derivative Spectrometer Using a Large-Aperture Piezoelectric Micromachined Device The engineering of optomechanical systems has exploded over the last decades, with many geometries and applications arising from the coupling of light with mechanical motion. The modulation of electromagnetic radiation in the terahertz (THz) frequency range through optomechanical systems is no exception to this tremendous quest. However, some fundamental modulation capabilities for THz communications and/or high-speed data processing applications are yet to be established. Here, this example demonstrates a THz time-domain derivative spectrometer based on a piezoelectric micromachined (PM) device. Insertion of the PM device into the THz beam path provides reference modulation for the lock-in detection unit, which in turn provides access to the $n^{th}$-order derivative information of the incoming THz signal. Strikingly, the integration of the recorded derived signal leads to a recovered reference signal with an equivalent or even better signal-to-noise ratio, opening the door to a new type of highly sensitive THz measurements in the time domain.

In recent decades, the development of several techniques for the generation and detection of electromagnetic waves in the terahertz (THz) frequency range has led to a wide range of applications in the fields of security, nondestructive testing, spectroscopy, telecommunications, imaging and microscopy. In order to improve the performance of THz systems in these various applications, the design of innovative and efficient modulators in this frequency range is the subject of intense research activity, particularly for sensing applications and data transmission systems. As in the world of optics for ultrafast signal processing, it would be necessary to design and implement fundamental mathematical operators, such as differentiator, integration and Hilbert transformer. A differentiator is one of these fundamental operators that performs the mathematical action of differentiating an input signal. In the same way, an $n^{th}$-order derivative type differentiator provides an $n^{th}$-order derivative type output signal derived from an arbitrary input signal, which can be a function of time, frequency or wavelength (with denoting n a positive integer). Differentiators have been realized for the ultrafast processing of light in the temporal, spatial and spectral domains, which have generally been realized using special fiber-optic routing and wave-mixing devices. When dealing with slowly varying optical signals, a simple method to obtain the derivative of the input signal is the use of an RC filter in combination with a modulation device in the optical path, such as a tachometer. This latter case is a well-established method that has been used for decades is known as derivative spectroscopy.

While ultrafast optical differentiator and derivative spectroscopy approaches deal with the complex envelope of the intensity profile of an input signal, THz measurement systems provide direct access to the amplitude and phase of the electric field, thanks to coherent methods of generation and detection by sampling. This additional feature can have several advantages for signal processing in the THz range. One such advantage is the use of low-frequency electronic tools to recover ultra-fast THz phenomena, such as a lock-in amplifier. Since a lock-in amplifier is already a sophisticated resistor-capacitor (RC) filter, the addition of only a suitable modulator could in principle transform the traditional THz time-domain spectroscopy (THz-TDS) system into a THz time-domain derived spectrometer (THz-TDDS). As in the world of electronics, an accurate reading of the derived THz signal could quickly measure the slope and/or the position of the peak in the time-varying signal. Derived information could also be applied to allow the precise identification of fixed points, such as local maxima and minima. The latter case could be of great interest for THz phase-contrast imaging, improving the accuracy of layer detection or refractive index changes. However, to date, only a few attempts have been made to demonstrate passive THz time differentiators, using a grating and a silicon ring resonator. In the first example of the present disclosure, there is reported an active THz time differentiator with an 8×8 piezoelectric micromachined ultrasonic transducer (PMUT) array. Nevertheless, the latter demonstration was limited due to the small pixel size and the small motion of the PMUT unit cell relative to the THz propagation path. Additionally, the need of using a voltage driver with MHz oscillator tends to make its use less convenient for the lock-in amplifier.

This example presents an $n^{th}$-order THz time-domain derivative spectrometer using a piezoelectric micromachined device (PM) with a surface area>mm² and operating in the kHz frequency range. Originally designed for energy harvesting, once inserted in the THz beam path as a modulator, this new device has an impressive performance to accurately measure not only the first derivative of the incoming signal, but the results show a good response up to the fourth-order derivative.

FIG. 16A shows the PM device with its electrodes for controlling and activating displacements. The PM device has been fabricated using the commercial PiezoMUMPS process from MEMSCAP. The surface area covers 2.1×2.1 mm² on a 0.4 mm thick silicon-on-insulator (SOI) substrate. This metallic multilayer device (see FIG. 16B) consists of a stack of from top to bottom: 1 μm thick aluminum (Al), 0.02 μm thick chromium (Cr), and a 0.5 μm thick piezoelectric material (aluminum nitride) deposited on the 10 μm thick top silicon (Si) layer of the SOI substrate. As shown in FIG. 16A, the metallic multilayer acts as an upper electrode layer and the Si layer acts as the lower electrode to electrically control the displacement of the structure. To avoid short circuits where needed, an additional insulating layer of silicon dioxide with 0.2 μm is deposited between the Si layer and the metallic multilayer stack.

To allow large vertical movements around its resting position, the structure is suspended above an empty cavity with an area of 1.7×1.7 mm², as illustrated in FIG. 16C. Inside this cavity, the maximum round-trip displacements perpendicular to the plane of the substrate for the darker wing, the lighter wing and the central part of the device are 12.67 μm, 2.45 μm and 1.42 μm, respectively. The PM device is a resonator. Therefore, it is possible to excite it with a sinusoidal excitation with a single frequency in which case each moving part of the PM will oscillate at the same frequency. Thereafter this frequency will be referred to as the modulation frequency ($f_{mod}$). To achieve the maximum displacement at $f_{mod}$, an external sinusoidal electric field of 20 V peak-to-peak at 10.82 kHz is applied across the electrodes.

To understand the difference between a typical THz wave measurement and the use of the device, it is important to recall the basic concept of lock-in detection. A lock-in amplifier is a kind of AC voltmeter that mixes an input signal with a periodic reference signal. For THz-TDS measurements, the electro-optical sampling method is commonly used and requires a lock-in amplifier. This method involves either a mechanical chopper or a control of the bias voltage of a photoconductive antenna (PCA), the latter acting as an ON-OFF switch of the input signal.

Unlike the electronic modulation of a PCA or the mechanical chopping of the THz signal, the device does not modulate the input signal ON and OFF. In fact, the PM device induces a small change in the path length of the THz beam. This modulation causes the physical system of interest (i.e., the THz signal) to respond with a frequency $f_{mod}$, whereas the detector and lock in amplifier convert its response into a voltage. For a lock-in amplifier, a stimulus s(t) of amplitude A and oscillating with an angular frequency $\Omega_{mod}$, which is $2\pi f_{mod}$, around an average values can be express by:

$$s(t) = \bar{s} + A \sin(\Omega_{mod} t) \quad (3)$$

Upon application of the stimulus, the detector reads a time-varying signal V(t):

$$V(t) = V(s(t)), \quad (4)$$

Under the assumption that the modulation A is sufficiently small, one can approximate V(s) by a Taylor-series expansion about s. Passing through the lock-in amplifier provides an output that is proportional not only to the modulation A, but also to the derivative of the system's response to the stimulus, evaluated at $s=\bar{s}$:

$$V_{out} \approx \frac{A}{\sqrt{2}} \frac{dV}{ds}\bigg|_{\bar{s}} \quad (5)$$

According to equation (5), changing the ON-OFF modulation for a change in THz path length converts a THz-TDS system into a THz derivative spectrometer. Furthermore, as with derivative spectroscopy, reading the $N^{th}$-order harmonic signal from the lock-in should, in principle, provide access to the $N^{th}$-order derived function of the modulated signal.

To describe the functionality of a THz derivative spectrometer obtained by combining a PM device with a lock-in amplifier, FIG. 17 shows the relationship between the motion of a part of the PM device (see the green wings at the top of the figure) as a function of the lock-in detection phase. In FIG. 17A, assuming an excitation frequency at $f_{mod}$ with 20 V peak-to-peak, a phase change of $2\pi c$ corresponds to a complete excursion of about 12 μm on the wing edge. In such a condition, the PM motion still induces a sufficiently small differential response $\Delta E/\Delta t$, i.e., greater than the detected bandwidth of the measured THz pulses, to recover a derivative measurement. In FIGS. 17B, 17C and 17D, there are shows the values of the phases with respect to the excitation frequency $f_{mod}$ corresponding to the second, third and fourth harmonic functions of the lock-in amplifier, respectively. In these cases, the harmonic function of the lock-in amplifier allows the slope of the slope to be determined, and so on as the harmonic value is increased.

Figure 18A:
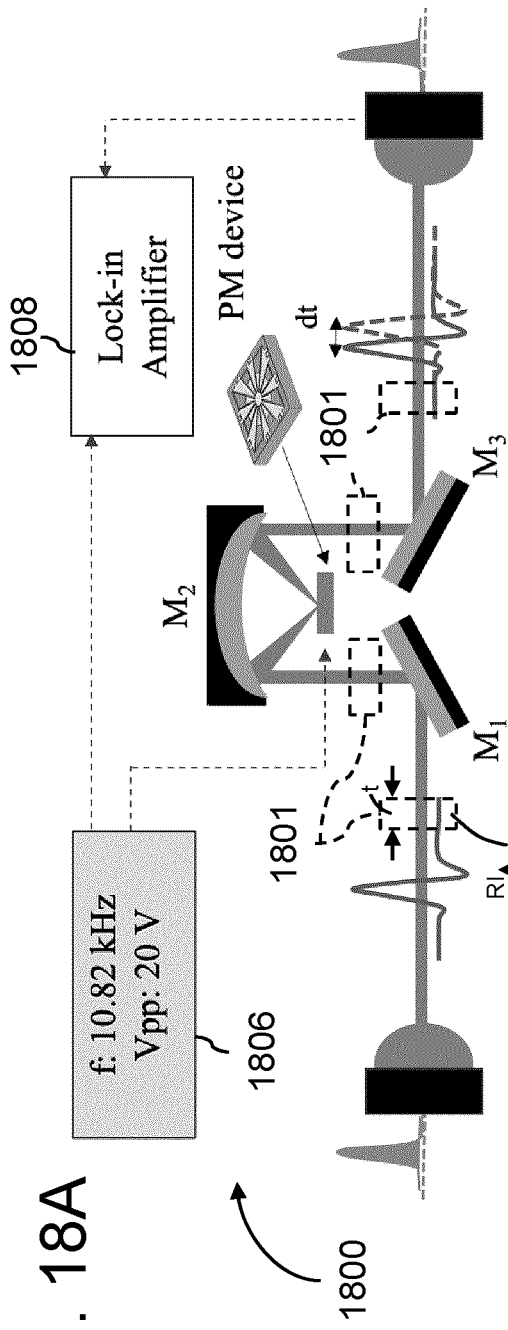
FIG. 18A is a schematic view of an example of a terahertz time-domain derivative spectrometer incorporating a terahertz modulation system with the PM device of FIG. 16A, in accordance with one or more embodiments.

FIG. 18A shows an example of a terahertz time-domain derivative spectrometer 1800 for analyzing one or more samples 1801. As depicted, the spectrometer 1800 has a terahertz signal emitter 1806 emitting a terahertz signal along a path extending across the sample(s) 1801. As discussed, the terahertz signal having an electric field of a given amplitude and a given phase varying over time. The spectrometer 1800 has a terahertz modulation system incorporating the PM device of FIG. 16A. Although the PM device of FIG. 16A is shown, any other suitable terahertz modulation system disclosed herein can be used. As shown, the PM device has a terahertz interacting surface receiving the terahertz signal and moving in back-and-forth sequences between first and second positions upon actuation with a modulation signal. When the modulation signal carries a resonance frequency of the PM device, the terahertz interacting surface can move in resonance between the first and second positions. The spectrometer 1800 has a terahertz signal detector 1808 synchronously measuring the modulated portion of the terahertz signal using the modulation signal, and generating a differential signal indicative of a derivative of the varying amplitude over time. When used in conjunction with a controller (not shown in FIG. 18A), a time-domain spectroscopic measurement on the sample(s) 1801 can be performed based on the differential signal. The time-domain spectroscopic measurement can include retrieving at least one of the given amplitude and the given phase varying over time. In some embodiments, the controller is configured to retrieve the amplitude and/or phase by integrating the differential signal over time. In some embodiments, the controller is configured to perform a step of characterizing a refractive index (RI) profile of the sample(s) 1801 based on the retrieved phase of the terahertz signal. As shown, the RI profile 1803 may change as a function of the thickness t of the sample 1801, in which the thickness t is parallel to the axis of propagation of the terahertz signal cross the sample 1801. In some embodiments, interfaces in the sample(s) 1801 are revealed by slope changes in the time-domain differential signal including, but not limited to, slope changes in the time-domain electric field amplitude or electric field phase of the terahertz signal. For instance, in some embodiments, clear interfaces of the sample(s) 1801 can be resolved by identifying odd-order differential signals, e.g., the differential signal crossing zero, in the n-order harmonics of the differential signal.

Figure 18C:
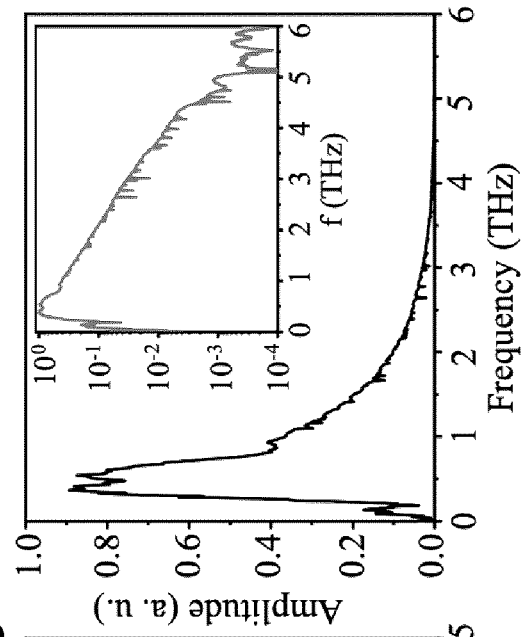
FIGS. 18B and 18C are graphs showing the electric field profile and spectrum of a THz pulse as measured using the terahertz time-domain derivative spectrometer of FIG. 18A, in accordance with one or more embodiments.
Figure 18B:
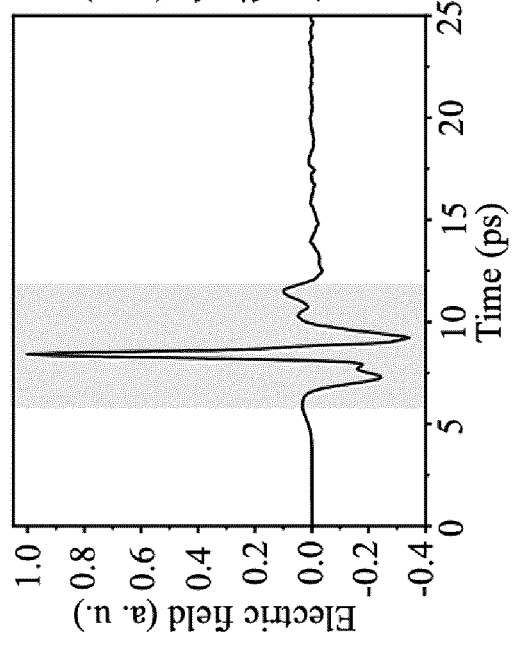

Terahertz spectroscopy is well-known for the characterization of THz devices, such as modulators, filters and artificial metamaterials, to name a few applications. Similar to these experiments, a THz-TDS system based on the transmission and detection of THz waves by two PCAs from TeraVil Ltd was used. The PCAs were pumped using a Ti:Sapphire laser oscillator providing 810 nm, 40 fs laser pulses at a repetition rate of 80 MHz and an average power of 20 mW on each antenna. The hemispherical silicon lens at the back of the transmitting antenna collimates the THz output beam with a diameter of about 10 mm. As shown in FIG. 18A, the collimated THz beam is guided by a gold-coated flat mirror, followed by a concave mirror 3 inches in diameter and 3 inches in focal length. The PM device is located exactly at the focus of the concave mirror, and the reflected beam returns symmetrically to the opposite side of the concave mirror, where the THz beam is recollimated. Finally, another gold-coated flat mirror guides the THz beam to the high resistivity hemispherical silicon lens of the PCA detector. The latter focuses the THz beam on the micrometer gap of the antenna In order to study the behavior of the PM device, the THz signal was measured without any external electric field applied to the device, as shown in FIG. 18B. In this case, the PM device is considered at rest, behaves like a metallic mirror, and only the THz transmitting antenna is biased with a voltage of 40 V modulated at a repetition frequency of 30 kHz. This ON-OFF modulation on the emitted field of the transmitting antenna is the typical lock-in detection operation used for the standard THz-TDS configuration, hereinafter referred to as the THz reference measurement. FIGS. 18B and 18C show the THz pulse reflected from the PM device (i.e., in the state of rest) and its fast Fourier transform (FFT) spectra, which reveal a bandwidth of 0 to 5 THz with the central frequency located at 0.7 THz.

To study the modulation effect of the PM device on the THz signal, the lock-in detection is referenced to the 10.82 kHz excitation frequency obtained using an AC signal generator. FIG. 19 shows the time traces (in red) obtained with the lock-in amplifier and the PM device activated for (a) the first harmonic, (b) second harmonic, (c) third harmonic and (d) fourth harmonic. The black trace represents the reference signal, i.e. the one obtained with the emitter modulated ON and OFF. The traces in blue represent (a) the first derivative, (b) second derivative, (c) third derivative and (d) fourth derivative of the reference signal obtained using the mathematical derivation function. FIG. 19 shows that the signal modulated by the PM device (in red) is slightly different from the one calculated (in blue). This difference is mainly observed for the first (a) and second derivative (b), while a great similarity exists between the experimental and calculated data for the third (c) and fourth derivatives (d). Nevertheless, as expected for the derivative functions shown in FIG. 19, the slope of the reference signal is recovered by the odd-order derivatives ($1^{st}$ and $3^{rd}$), while the peak of the reference signal is found by the even-order derivatives ($2^{nd}$ and $4^{th}$), as expected for the derived function.

As THz measurements are performed on the electric field as a function of time, the FFT allows us to move into the frequency domain to analyze the information in amplitude and phase. FIG. 20 shows the normalized amplitude spectra in a linear scale of the reference signal (black curves), and in red the signals derived from (a) first, (b) second, (c) third and (d) fourth order recovered by the PM device. The blue curves represent (a) the first-order, (b) second-order, (c) third-order and (d) fourth-order derived signals calculated from the reference signal. As for the information in the time domain, there is some difference in the low-frequency part between the calculated and experimental spectra, but mainly for the first-order derivative, see FIG. 20A. As depicted, as shown in the shaded area, it can be seen that frequencies around 0.7 THz are modulated differently from their higher frequency counterpart (i.e., frequencies shorter than 1 THz or wavelengths longer than 300 µm). The increase in the order of the derivatives produces a closer agreement between the experimental information and the calculated derived information, see FIGS. 20B, 20C and 20D.

These discrepancies between the low and high frequencies of the first derivative signal are partly due to the complex motion of the PM and the wave diffraction principle. Therefore, the spatial distribution is dictated by the diffraction limited condition at focus and is not uniform with frequency. In other words, only long wavelengths are reflected from the entire substrate (2.1×2.1 mm²), in contrast to shorter wavelengths, which are mainly reflected at its center. In this case, it is reasonable to assume that the low frequency part of the spectrum is more affected by the complex geometry of the device, while the higher frequencies are mainly located in a uniform area, the central part.

Moreover, as mentioned previously, the reference signal is taken for a complete reflection on the whole substrate and the whole device simultaneously. However, the modulated signal only comes from the reflection of the moving complex geometry of the device. Only this "complex" signal should be used for comparison purposes, as a reference. Unfortunately, this reference information is inaccessible to obtain experimentally with this device. Fortunately, one may have to stress that since the derivative function acts as a high-pass filter, the transition to higher-order derivative information becomes less sensitive to the complex geometry of the device, or to the discrepancy observed at low frequencies. The shift of the peak position of the spectra towards higher frequencies, up to 2.5 THz for the $4^{th}$ derivative order, confirms this high-pass filtering effect and is in a very good agreement between the calculated and measured high-order derivative, see FIGS. 20B, 20C and 20D.

Figure 21:
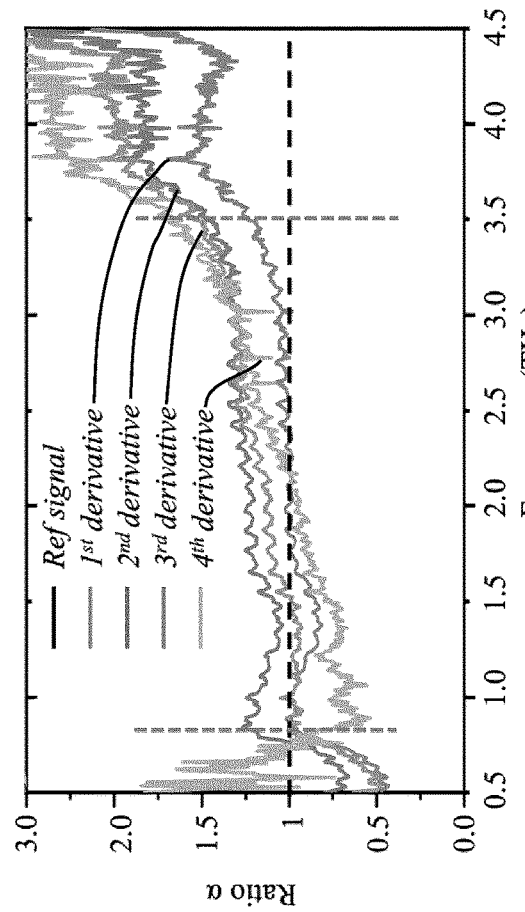
FIG. 21 is a graph showing phases of the modulated THz signals of FIGS. 19A-D compared to phases of the reference THz signals, in accordance with one or more embodiments.

To confirm the quality of the derivative measurements, FIG. 21A shows the normalized amplitude and phase between the experimental data and the expected signal, i.e., those calculated from the reference signal. Normalization is expressed by the ratio between the experimental signal and the calculated derivative signal depends on the frequency, called $\alpha(\omega)$, as follows:

$$\alpha(\omega) = \frac{N^{th} \text{ order derivative of Exp.}}{\frac{d^N(Ref)}{dt^N}}, \quad (6)$$

where N is the derivative order, Ref. and Exp. are the reference and experimental modulated THz signal, respectively.

In order to qualitatively evaluate the purity of the experimentally derived signals, a ratio $\alpha$ equal or close to 1 would mean perfect agreement. In FIG. 21A, the results of this calculation show that the ratio $\alpha$ for the frequency range between 0.7 THz to 3.5 THz is almost flat around 1, which clearly indicates a good performance of the PM device with a lock-in amplifier as a THz derivative spectrometer. Only for frequencies below 0.7 THz did the performance of the PM device not allow accurate recovery of the "readable" original signal.

A second indication of the good performance of the THz derivative spectrometer is the achievable signal-to-noise ratio (SNR). In general, derivative spectroscopy has the disadvantage of poor SNR. To evaluate if the THz derivative spectroscopy with this method suffers from the same problem, the SNR of the original reference signal was compared with those obtained from the derivative measurements. An interesting way to carry out this comparison on a comparable scale is to recover the reference signal from the integration of the measured derivative signals. For example, the integral of the $1^{st}$ order derivative measurement leads to the reference signal. Similarly, the double integral of the measured signal of the $2^{nd}$ order derivative also leads to the reference signal, and so on. However, it was found that by increasing the number of integrations on the signal, the DC component in the generated FFT signal was amplified. As a result, a succession of integral calculations on the higher-order derivative signals loses accuracy to overlap with the original signal. Mainly, this low-frequency component translates into a very slow slope offset on the time-domain signals. On the other hand, the positive result of the integration is its low-pass filtering action, which nicely eliminates the high-frequency noise level.

Figure 22:
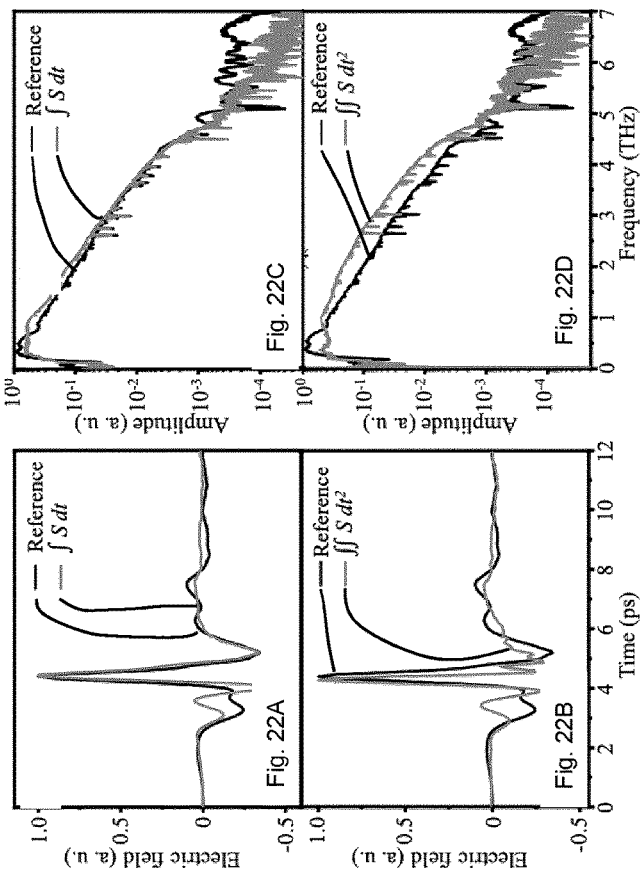
FIGS. 22A and 22B are graphs showing the integral of the first-order and second-order derivatives of the reference THz signal, with the corresponding spectra in FIGS. 22C and 22D, in accordance with one or more embodiments.

FIGS. 22A and 22B show the $1^{st}$ and $2^{nd}$ order integration of the detected modulated THz signal in the time domain and FIGS. 22C and 22D their respective frequency spectra. By way of comparison, the black curves of each figure are the reference signal in the time and frequency domains. For a fair comparison, it is important to note that all scans were done with the same scale and integration time. As expected, the signals of the first-order integral in the time and frequency domain are similar to the measured reference signal, except for the low-frequency part. In FIG. 22C, the SNR between the reference signal and the integrated signal are surprisingly comparable, without any sign of SNR degradation. Even more strikingly, compared to its reference, the double-integrated signal in FIG. 22D has an order of magnitude better dynamic range in the frequency range of 1 to 3 THz, i.e., in the operational range of the device.

In order to simulate the effect of the PM device on the THz field, Lumerical's FDTD (Finite-Difference-Time-Domain) software was used. As the simulations produce discrete information, the differentiation function must be expressed as an analytical expression in the form of a set of discrete points. Further, two configurations of the PM device were simulated: first for a uniform displacement such as a plane mirror and second for a complex angular displacement, closer to the experimental reality of the PM device. The formula of the central difference approximation of the derivatives was used. This derivative function allows to estimate the derivation from points on both sides of the central point at which the derivative is calculated. For example: Two-point and three-point central difference formula for the first and second derivative is derived using, $$f'(d_i) = \frac{f(d_{i+1}) - f(d_{i-1})}{2h}, \quad (7)$$

$$f''(d_i) = \frac{f(d_{i-1}) - 2f(d_i) + f(d_{i+1})}{h^2}, \quad (8)$$

where h is the difference between the points in time, is the central point of origin, while $d_{i+1}$ and $d_{i-1}$ are lateral points as displacements of the device, for example ±6.33 µm for a round trip of 12.66 µm.

Figures 23A, 23B:
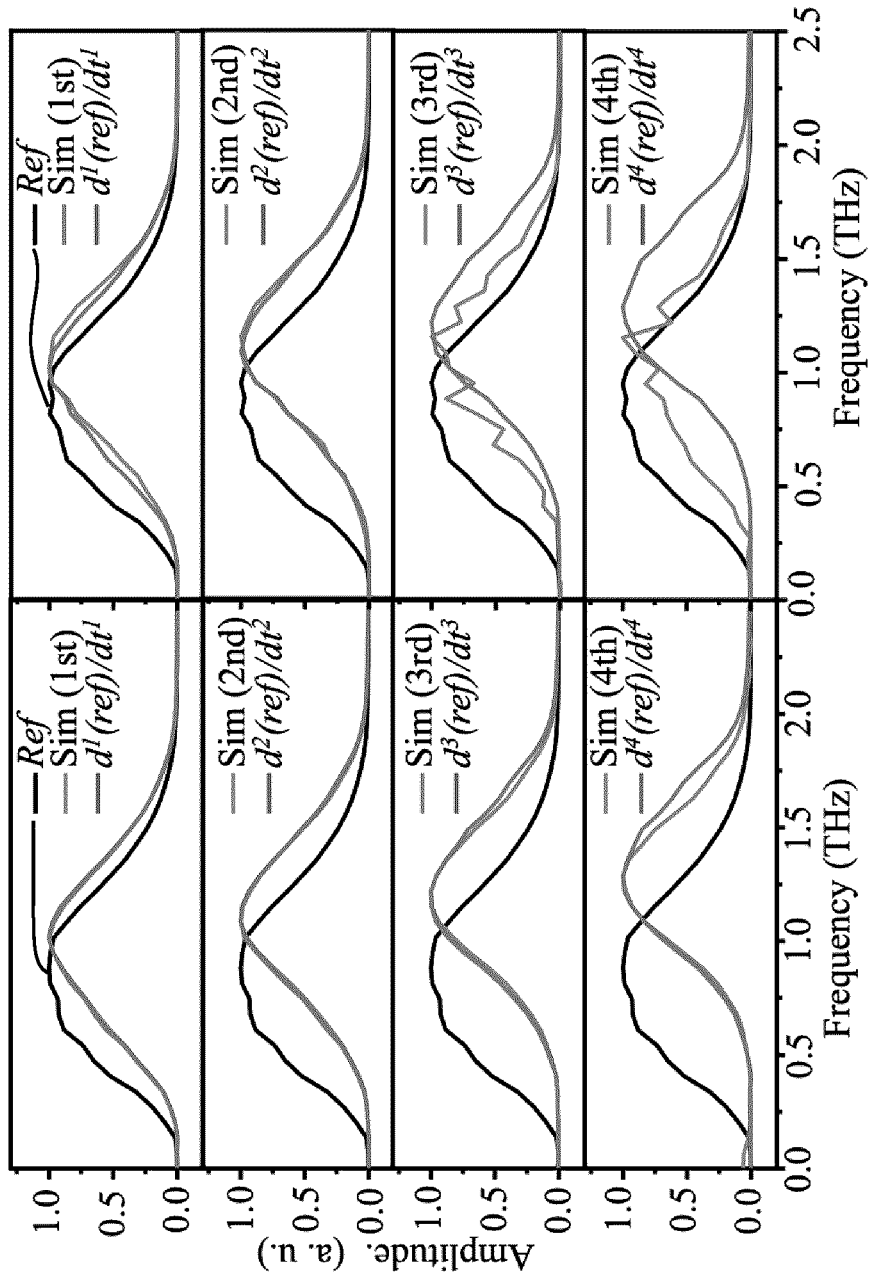
FIGS. 23A and B are graphs showing simulated spectra differentiated by finite-difference-time-domain and calculated from the reference THz signal for first-, second-, third- and fourth-order derivatives obtained from uniform displacement in FIG. 23A and from angular displacement in FIG. 23B.

The simulation results for the differentiation of order 1, 2, 3 and 4 are presented in FIG. 23, with FIG. 23A the reflection on a flat surface and FIG. 23B on a complex surface. A perfect agreement is found using simulation from a flat mirror. In contrast, the simulations for the complex geometry produce a significant reading error. This discrepancy may be attributed to the fact that the simulations are performed with discrete points and the background signal from the stationary parts of the device is several orders of magnitude larger than the simulated changes, which could not be resolved.

Using a large aperture PM device, a strategy was investigated to convert the traditional THz-TDS system into a derivative THz spectrometer. The results presented herein confirm that the THz signal modulated by the PM device provides access to the nth order derivation of THz pulses. Good agreement was found by found up to the 4th derivation. Moreover, after the integration of the nth-order derivative signal, the recovered information shows an increase of the SNR compared to its reference signal. This demonstration could be very useful for fine THz spectroscopy where the phase changes on a signal is the critical parameter to improve. In the near future, this differentiator can be implemented as a two-dimensional uniform motion matrix that would allow the development of new methods for computational imaging and advanced manipulation of THz pulses.

As can be understood, the examples described above and illustrated are intended to be exemplary only. Although the electromechanical transducer examples described above are shown with terahertz interacting surfaces that are circular in shape, it is envisaged that the shape of the terahertz interacting surfaces can be different in some other embodiments. For instance, each terahertz interacting surface can have a triangle shape, an ovoidal shape, a rectangular shape or any other suitable shape. In some embodiments, the terahertz interacting surface may be shaped in one or more concentric annular surfaces which collectively reflect or otherwise interact with the terahertz signal. In some embodiments, it may be preferred to move the terahertz interacting surface in resonance between the first and second positions. However, in some other embodiments, the terahertz interacting surface may not move in resonance. Accordingly, the frequency of the modulation signal may or may not be a resonance frequency of the electromechanical transducer. Further, the modulation signal can have any waveform including, but not limited to, sinusoidal shape, square shape, triangle shape and the like. The scope is indicated by the appended claims.

What is claimed is:

1. A terahertz modulation system comprising:
a terahertz signal emitter emitting a terahertz signal along a path;
a modulation unit having a substrate and an electromechanical transducer actuatably mounted to said substrate, said electromechanical transducer having a terahertz interacting surface in said path receiving said terahertz signal and moving in back-and-forth sequences between first and second positions relative to said path upon actuation with a modulation signal, said moving modulating at least a portion of said terahertz signal; and
a terahertz signal detector downstream from said modulation unit along said path, said terahertz signal detector synchronously measuring said modulated portion of said terahertz signal using said modulation signal, and generating a differential signal indicative thereof.

2. The terahertz modulation system of claim 1 wherein said modulation signal carries a resonance frequency of said electromechanical transducer, said terahertz interacting surface moving in resonance between said first and second positions.

3. The terahertz modulation system of claim 1 wherein said differential signal is indicative of a difference between said terahertz signal interacting with said terahertz interacting surface at said first position and the terahertz signal interacting with said terahertz interacting surface at said second position over a given period of time.

4. The terahertz modulation system of claim 3 wherein said difference indicates a rate of change of an electric field amplitude of said terahertz signal over said period of time.

5. The terahertz modulation system of claim 1 further comprising a controller having a processor and a memory having stored thereon instructions that when executed by said controller perform the steps of: determining an indication of said terahertz signal by integrating said differential signal over said period of time.

6. The terahertz modulation system of claim 1 wherein said terahertz interacting surface is a terahertz reflecting surface receiving said terahertz signal from an upstream portion of said path and reflecting said terahertz signal along a downstream portion of said path.

7. The terahertz modulation system of claim 1 wherein said electromechanical transducer comprises a plurality of electromechanical transducers actuatably mounted to said substrate, said electromechanical transducers having terahertz interacting surfaces being independent from one another.

8. The terahertz modulation system of claim 7 wherein said electromechanical transducers have a common resonance frequency.

9. The terahertz modulation system of claim 8 wherein said terahertz interacting surfaces of said electromechanical transducers form a plane moving in resonance between said first and second positions relative to said path upon actuation with a modulation signal at said common resonance frequency.

10. The terahertz modulation system of claim 7 wherein said terahertz interacting surfaces of said electromechanical transducers move independently from one another upon actuation with respective modulation signals at different frequencies.

11. The terahertz modulation system of claim 1 wherein said electromechanical transducer is one of an ultrasound transducer and a piezoelectric transducer.

12. A method of modulating a terahertz signal, the method comprising:
emitting a terahertz signal along a path and across a terahertz interacting surface of an electromechanical transducer;
modulating at least a portion of said terahertz signal by moving said terahertz interacting surface of said electromechanical transducer in back-and-forth sequences between first and second positions across said path, said moving resulting from actuating said electromechanical transducer with a modulation signal; and
synchronously measuring said modulated portion of said terahertz signal using said modulation signal, and generating a differential signal indicative thereof.

13. The method of claim 12 wherein said modulation signal carries a resonance frequency of said electromechanical transducer, said terahertz interacting surface moving in resonance between said first and second positions.

14. The method of claim 12 wherein said differential signal is indicative of a difference between said terahertz signal interacting with said terahertz interacting surface at said first position and said terahertz signal interacting with said terahertz interacting surface at said second position over a given period of time.

15. The method of claim 14 further comprising, using a controller, determining an indication of said terahertz signal by integrating said generated differential signal over said period of time.

16. The method of claim 12 wherein said terahertz signal has an electric field of a given amplitude and of a given phase varying over time, said differential signal being indicative of a rate of change of said amplitude over time.

17. The method of claim 16 further comprising, using a controller, resolving a phase of said terahertz signal based on said rate of change of said amplitude over time.

18. A terahertz time-domain derivative spectrometer for analyzing a sample, the terahertz time-domain derivative spectrometer comprising:
a terahertz signal emitter emitting a terahertz signal along a path extending across said sample, said terahertz signal having an electric field of a given amplitude and a given phase varying over time;
a terahertz interacting surface receiving said terahertz signal and moving in back-and-forth sequences between first and second positions upon actuation with a modulation signal;
a terahertz signal detector synchronously measuring said modulated portion of said terahertz signal using the modulation signal, and generating a differential signal indicative of a derivative of said varying amplitude over time;
a controller performing a time-domain spectroscopic measurement on said sample based on said differential signal, including retrieving at least one of the given amplitude and the given phase varying over time.

19. The terahertz time-domain derivative spectrometer of claim 18 wherein said retrieving includes integrating said differential signal.

20. The terahertz time-domain derivative spectrometer of claim 18 further comprising characterizing a refractive index profile of said sample based on the retrieved phase of the terahertz signal.

* * * * *